United States Patent
Yamagami et al.

[11] Patent Number: 6,121,786
[45] Date of Patent: Sep. 19, 2000

[54] SEMICONDUCTOR INTEGRATED CIRCUIT

[75] Inventors: Yoshinobu Yamagami; Akinori Shibayama, both of Kyoto, Japan

[73] Assignee: Matsushita Electric Industrial Co., Ltd., Osaka, Japan

[21] Appl. No.: 09/106,150

[22] Filed: Jun. 29, 1998

[30] Foreign Application Priority Data

Jun. 30, 1997 [JP] Japan .................................. 9-173807

[51] Int. Cl.$^7$ .................................................. G01R 31/28
[52] U.S. Cl. ...................................... 324/765; 324/158.1
[58] Field of Search .................................. 324/765, 763, 324/158.1, 73.1; 714/733, 734; 365/201

[56] References Cited

U.S. PATENT DOCUMENTS

| | | | |
|---|---|---|---|
| 5,349,290 | 9/1994 | Yamada | 324/158.1 |
| 5,404,099 | 4/1995 | Sahara | 324/158.1 |
| 5,424,990 | 6/1995 | Ohsawa | 365/201 |
| 5,519,333 | 5/1996 | Righter | 324/765 |

FOREIGN PATENT DOCUMENTS 06021376  1/1994  Japan .

*Primary Examiner*—Ernest Karlsen
*Attorney, Agent, or Firm*—McDermott, Will & Emery

[57] ABSTRACT

A semiconductor integrated circuit including an internal voltage step down circuit exhibits a first voltage characteristic I having substantially no dependence on an external power supply voltage VEXT and holding an internal power supply voltage VINT at a constant voltage VA if the external power supply voltage VEXT is in the range between two predetermined values V1 and V2. On and after the external power supply voltage VEXT exceeds the predetermined value V2, the circuit exhibits a second voltage characteristic II, in which the internal power supply voltage VINT varies from the constant voltage VA in accordance with the external power supply voltage VEXT, during a non-accelerated test (operation margin certification test). On the other hand, during the accelerated test, the circuit exhibits a third voltage characteristic III in which the internal power supply voltage VINT reaches a certain voltage VB (>VA) and goes on increasing from VB in accordance with the external power supply voltage VEXT. Thus, during the operation margin certification test, the internal power supply voltage VINT exhibits continuously varying characteristics I and II and the operation of the circuit can be assured in the voltage range from VA to VB. During the accelerated test, a voltage can be increased at a sufficiently high rate owing to the characteristic III.

25 Claims, 17 Drawing Sheets

SEMICONDUCTOR INTEGRATED CIRCUIT

BACKGROUND OF THE INVENTION

The present invention relates to a semiconductor integrated circuit, and more particularly relates to an improved semiconductor integrated circuit including an interval voltage step down circuit.

In recent years, a device like a transistor included in a semiconductor integrated circuit has been continuously and drastically downsized, and therefore the breakdown voltage of the transistor has been decreasing. It is necessary to ensure required reliability for such a transistor and it is also required to operate the circuit with even lower power consumption. Thus, a semiconductor integrated circuit including an internal voltage step down circuit for stepping down an external power supply voltage inside the circuit and for driving the internal circuit thereof with the stepped-down voltage has gained a dominant position in the pertinent art lately.

Also, in general, in order to distinguish good semiconductor integrated circuit products from defective ones, an operation margin certification test is carried out. In such a test, it is determined whether or not the semiconductor integrated circuit operates in such a manner as to satisfy the required specifications by applying, to the semiconductor integrated circuit, a voltage several percent higher than the upper limit or several percent lower than the lower limit of the operability assuring voltage range of the semiconductor integrated circuit by the use of a memory tester or a logic tester. Also, in order to effectively screen the early failure of a semiconductor integrated circuit, an accelerated test, i.e., a so-called "burn-in test", is carried out. In the test, a voltage exceeding the operability assuring voltage range of the semiconductor integrated circuit is applied thereto for a predetermined period of time at a high temperature.

Hereinafter, the characteristics of conventional semiconductor integrated circuits will be described.

The characteristics of an internal power supply voltage VINT with respect to an external power supply voltage VEXT applied to a semiconductor integrated circuit including an internal voltage step down circuit are classified into the three types illustrated in FIGS. 20A, 20B and 20C, respectively. In any of the three types of characteristics, while the external power supply voltage VEXT is in the range from "0" to a predetermined value V1, the internal power supply voltage VINT rises in proportion to the external power supply voltage VEXT. On the other hand, while the external power supply voltage VEXT is in the range from the predetermined value V1 to another predetermined value V2, the internal power supply voltage VINT is at a constant value VA. Thus, if the operability assuring voltage range of the external power supply voltage applied to a semiconductor integrated circuit is equal to or larger than the predetermined value V1 and smaller than the predetermined value V2, the internal circuit thereof is driven with the constant voltage VA. As a result, the semiconductor integrated circuit can operate stably without depending on the external power supply voltage. However, on and after the external power supply voltage VEXT reaches the predetermined value V2, the internal power supply voltage VINT, which has been the constant voltage VA so far, will go on rising in proportion to the external power supply voltage VEXT. Such voltage characteristics are typically exhibited during an accelerated test and determined for the purpose of increasing the voltage to be applied to the internal circuit during the accelerated test by increasing the internal power supply voltage, which has been the constant voltage VA till then. In the case of FIG. 20A, as soon as the external power supply voltage VEXT reaches the predetermined value V2, the internal power supply voltage VINT rises from the constant voltage VA to a voltage VB. Then, the internal power supply voltage VINT goes on rising at the same rise rate as that of the external power supply voltage VEXT. In the case of FIG. 20B, as soon as the external power supply voltage VEXT reaches the predetermined value V2, the internal power supply voltage VINT rises from the constant voltage VA to a voltage VC. Then, the internal power supply voltage VINT goes on rising from the voltage VC in proportion to the external power supply voltage VEXT. In the case of FIG. 20C, when the external power supply voltage VEXT reaches the predetermined value V2, the internal power supply voltage VINT starts rising from the constant voltage VA in proportion to the external power supply voltage VEXT.

FIGS. 19A, 19B and 19C are block diagrams illustrating exemplary configurations of the semiconductor integrated circuits corresponding to the three types of characteristics illustrated in FIGS. 20A, 20B and 20C, respectively.

In FIGS. 19A, 19B and 19C, the reference numeral 1 denotes a reference voltage generator; 2 denotes an accelerated test detector; 3 denotes a P-type MOS transistor; 4 denotes a reference voltage selector; 5 denotes an internal power supply circuit; 6 denotes an internal circuit; VREF1, VREF2, VREF3 denote reference voltages; VBI2 denotes an output signal of the accelerated test detector 2; VINT denotes an internal power supply voltage; and VEXT denotes an external power supply voltage. The respective operations of the semiconductor integrated circuits having such configurations will be described.

First, the operation of the semiconductor integrated circuit illustrated in FIG. 19A will be described. The reference voltage generated by the reference voltage generator 1 is constant at VA on and after the external power supply voltage VEXT reaches the predetermined value V1 as shown in FIG. 21A, and is output as the reference voltage VREF1. The accelerated test detector 2 determines whether or not an internal power supply voltage for an accelerated test should be generated. If the external power supply voltage VEXT is smaller than the predetermined value V2, the accelerated test detector 2 outputs a high-level signal as the output signal VBI2. On the other hand, on and after the external power supply voltage VEXT reaches the predetermined value V2, the accelerated test detector 2 outputs a low-level signal. Thus, the P-type MOS transistor 3, receiving the output signal VBI2 of the accelerated test detector 2 at the gate terminal thereof, is in the OFF state while the external power supply voltage VEXT is in the range from "0" to V2. On the other hand, on and after the external power supply voltage VEXT reaches V2, the P-type MOS transistor 3 is in the ON state. As a result, the reference voltage VREF1 has the characteristics shown in FIG. 21A while the external power supply voltage VEXT is in the range from "0" to V2, but comes to have the same characteristics as those of the external power supply voltage VEXT on and after the external power supply voltage VEXT reaches V2, because the P-type MOS transistor 3 is in the ON state. And based on the reference voltage VREF1, the internal power supply circuit 5 supplies the internal power supply voltage VINT for driving the internal circuit 6.

In this case, the internal power supply circuit 5 is generally constituted by a differential amplifier 7 and a P-type MOS transistor QP3 as shown in FIG. 22. In FIG. 22, the differential amplifier 7 includes: a pair of P-type MOS transistors QP1, QP2 constituting a current mirror; a pair of N-type MOS transistors QN1, QN2 serially connected to the P-type MOS transistors QP1, QP2, respectively; and an N-type MOS transistor QN3 for controlling the current flowing through the differential amplifier 7. The reference voltage VREF1 is applied to one input of the differential amplifier 7, i.e., the gate terminal of the N-type MOS transistor QN1. The internal power supply voltage VINT, which is the drain voltage of the P-type MOS transistor QP3, is applied to the other input of the differential amplifier 7, i.e., the gate terminal of the N-type MOS transistor QN2. The output of the differential amplifier 7, i.e., the drain voltage of the P-type MOS transistor QP1, is applied to the gate terminal of the P-type MOS transistor QP3.

Hereinafter, the operation of the internal power supply circuit 5 having the above-described configuration will be described.

As described above, the differential amplifier 7 receives the reference voltage VREF1 and the internal power supply voltage VINT as inputs. If the internal power supply voltage VINT is lower than the reference voltage VREF1, then the differential amplifier 7 outputs a low-level signal, turns ON the P-type MOS transistor QP3 on the next stage and then supplies the external power supply voltage VEXT as the internal power supply voltage VINT. On the other hand, if the internal power supply voltage VINT is higher than the reference voltage VREF1, then the differential amplifier 7 outputs a high-level signal and turns OFF the P-type MOS transistor QP3 on the next stage. By controlling the ON/OFF states of the P-type MOS transistor QP3 in this manner, the internal power supply voltage VINT, which is the drain voltage thereof, becomes equal to the reference voltage VREF1. The characteristics shown in FIG. 20A are exhibited by such a configuration.

Next, the operation of the semiconductor integrated circuit illustrated in FIG. 19B will be described. The reference voltage generator 1 generates two types of reference voltages VREF1 and VREF3. Of these two types of reference voltages generated, VREF1 has the characteristics shown in FIG. 21A in the same way as in the semiconductor integrated circuit shown in FIG. 19A. The other reference voltage VREF3 becomes equal to the reference voltage VC when the external power supply voltage VEXT is at the predetermined value V2, and then rises from VC in proportion to the external power supply voltage as shown in FIG. 21B. The accelerated test detector 2 performs the same operation as that performed by the counterpart in FIG. 19A and generates an output signal VBI2. The reference voltage selector 4 receives the two types of reference voltages VREF1 and VREF3 as inputs and selectively outputs one of them in response to the output signal VBI2 of the accelerated test detector 2. Assume the reference voltage selector 4 selectively outputs the reference voltage VREF1 when the output signal VBI2 is at a high level, and selectively outputs the reference voltage VREF3 when the output signal VBI2 is at a low level. In such a case, while the external power supply voltage VEXT is in the range from "0" to the predetermined value V2, the output of the reference voltage selector 4 exhibits the characteristics shown in FIG. 21A. On the other hand, on and after the external power supply voltage VEXT reaches the predetermined value V2, the output of the reference voltage selector 4 exhibits the characteristics shown in FIG. 21B. And, based on the reference voltage output from the reference voltage selector 4, the internal power supply circuit 5 generates the internal power supply voltage VINT for driving the internal circuit 6. The characteristics shown in FIG. 20B are exhibited by such a configuration.

Next, the operation of the semiconductor integrated circuit shown in FIG. 19C will be described. The reference voltage generator 1 generates two types of reference voltages VREF1 and VREF2. Of these two types of reference voltages, VREF1 has the characteristics shown in FIG. 21A in the same way as in the semiconductor integrated circuits shown in FIGS. 19A and 19B. That is to say, on and after the external power supply voltage VEXT reaches the predetermined value V1, the reference voltage VREF1 is constant at VA. The other reference voltage VREF2 becomes equal to the reference voltage VA when the external power supply voltage VEXT is at the predetermined value V2 and then rises from VA in proportion to the external power supply voltage VEXT as shown in FIG. 21C. And, based on either one of the two types of reference voltages generated VREF1 and VREF2 that is the higher one with respect to the same value of the external power supply voltage VEXT, the internal power supply circuit 5, receiving the higher reference voltage, outputs the internal power supply voltage VINT for driving the internal circuit 6. Specifically, while the external power supply voltage VEXT is smaller than the predetermined value V2, the internal power supply voltage VINT to be generated has the characteristics shown in FIG. 21A. On the other hand, on and after the external power supply voltage VEXT reaches the predetermined value V2, the internal power supply voltage VINT to be generated has the characteristics shown in FIG. 21C. The characteristics shown in FIG. 20C are exhibited by such a configuration.

The conventional semiconductor integrated circuits, however, have the following problems.

First, in the case of FIG. 20A, as soon as the external power supply voltage VEXT reaches the predetermined value V2, the internal power supply voltage VINT abruptly rises from the constant voltage VA to the voltage VB. That is to say, since such a semiconductor integrated circuit has discontinuous voltage characteristics, the characteristics of the internal circuit to be driven with the internal power supply voltage VINT in the range from VA to VB cannot be certified. Thus, in the operation margin certification test, the operation of the internal circuit cannot be assured unless the internal power supply voltage VINT is equal to or smaller than VA or equal to or larger than VB.

Next, in the case of FIG. 20B, as soon as the external power supply voltage VEXT reaches the predetermined value V2, the internal power supply voltage VINT abruptly rises from VA to VC. That is to say, since such a semiconductor integrated circuit also has discontinuous voltage characteristics, the same problems as those of FIG. 20A are caused.

Finally, in the case of FIG. 20C, even after the external power supply voltage VEXT has reached the predetermined value V2, the internal power supply voltage VINT has continuously varying voltage characteristics, unlike the discontinuous voltage characteristics shown in FIGS. 20A and 20B. Thus, the problems involved with the cases shown in FIGS. 20A and 20B can be avoided. However, the rise rate of the internal power supply voltage VINT after the external power supply voltage VEXT has reached the predetermined value V2 is lower than those of FIGS. 20A and 20B. Thus, the voltage to be applied to the internal circuit cannot be increased at a sufficiently high rate during the accelerated test.

SUMMARY OF THE INVENTION

The object of the present invention is to provide a semiconductor integrated circuit including an internal voltage step down circuit that can supply different internal power supply voltages suitable for operation margin certification test and accelerated test of the semiconductor integrated circuit, respectively.

In order to accomplish this object, during the operation margin certification test, the semiconductor integrated circuit of the invention generates continuously varying internal power supply voltages and thereby eliminates such an internal power supply voltage range as disabling the certification of the operating characteristics of an internal circuit. On the other hand, during the accelerated test, the semiconductor integrated circuit generates an internal power supply voltage sufficiently accelerating the rise rate of the voltage to be applied to the internal circuit.

Specifically, the semiconductor integrated circuit of the present invention includes: an internal circuit; and an internal voltage step down circuit for stepping down an external power supply voltage and supplying the stepped-down voltage to the internal circuit as an internal power supply voltage. The internal voltage step down circuit includes: a reference voltage generator for generating a plurality of reference voltages, the reference voltages including a first reference voltage having substantially no dependence on the external power supply voltage and a second reference voltage having dependence on the external power supply voltage; a first internal power supply circuit for generating a first internal power supply voltage based on the first reference voltage and then supplying the first internal power supply voltage to the internal circuit; a second internal power supply circuit for generating a second internal power supply voltage based on the second reference voltage and then supplying the second internal power supply voltage to the internal circuit; a reference voltage comparator, controlled in response to an accelerated test control signal output during an accelerated test of the internal circuit, for comparing the first reference voltage and the second reference voltage with each other; and an accelerated test voltage supply circuit for supplying a third internal power supply voltage for the accelerated test to the internal circuit in response to an output signal of the reference voltage comparator while the accelerated test is performed.

In one embodiment of the present invention, the internal power supply voltage exhibits: a first voltage characteristic having substantially no dependence on the external power supply voltage if the external power supply voltage is within an operability assuring voltage range; a second voltage characteristic having dependence on the external power supply voltage if the external power supply voltage is within a voltage range in which the second reference voltage is higher than the first reference voltage and while the non-accelerated test is being performed; and a third voltage characteristic having a rise rate higher than a rise rate of the second voltage characteristics and having dependence on the external power supply voltage if the external power supply voltage is within the voltage range in which the second reference voltage is higher than the first reference voltage and while the accelerated test is being performed.

In such a configuration, while not the accelerated test but the operation margin certification test is being performed, the semiconductor integrated circuit of the invention exhibits continuously varying internal power supply voltage characteristics including: the first voltage characteristic in which the internal power supply voltage to be generated is constant at the first reference voltage; and the second voltage characteristic in which the internal power supply voltage smoothly rises from the constant voltage in proportion to the external power supply voltage. Thus, an internal power supply voltage range disabling the certification of the operating characteristics of an internal circuit can be eliminated. On the other hand, while the accelerated test is being performed, since the internal power supply voltage exhibits the third voltage characteristic having a rise rate higher than that of the second voltage characteristic, a higher internal power supply voltage is generated and the voltage applied to the internal circuit can be increased at a sufficiently high rate.

In another embodiment of the invention, the accelerated test voltage supply circuit includes, between an external power supply terminal and a site where the internal power supply voltage is generated: a serial connection of a first MOS transistor controlled in response to the output signal of the reference voltage comparator and a second MOS transistor having a diode-connected gate; and a fuses connected in parallel to the second MOS transistor. If the external power supply voltage is within a voltage range in which the second reference voltage is higher than the first reference voltage during the accelerated test, the third internal power supply voltage is switchable by disconnecting the fuse.

In such a configuration, the present invention makes it possible to modify or reduce the third internal power supply voltage to be supplied during the accelerated test by the threshold voltage of the second MOS transistor.

In still another embodiment of the invention, an output of the reference voltage comparator has hysteresis characteristics. Thus, if the external power supply voltage is within a voltage range in which the second reference voltage is higher than the first reference voltage during the accelerated test, the third internal power supply voltage has hysteresis characteristics with respect to a variation of the external power supply voltage.

In such a configuration, even when the external power supply voltage is varied because of some noise or the like, the present invention can still attain stable internal power supply voltage characteristics.

In still another embodiment of the invention, the second internal power supply circuit is controlled in response to the output signal of the reference voltage comparator to stop supplying the second internal power supply voltage during the accelerated test.

In such a configuration, while the accelerated test is performed, the internal power supply circuit not involved with the test (i.e., not operating) is deactivated. Thus, the present invention can reduce the steady current flowing through the internal power supply circuit and thereby can reduce the power consumption of the overall circuit.

DETAILED DESCRIPTION OF THE INVENTION

Figure 1:
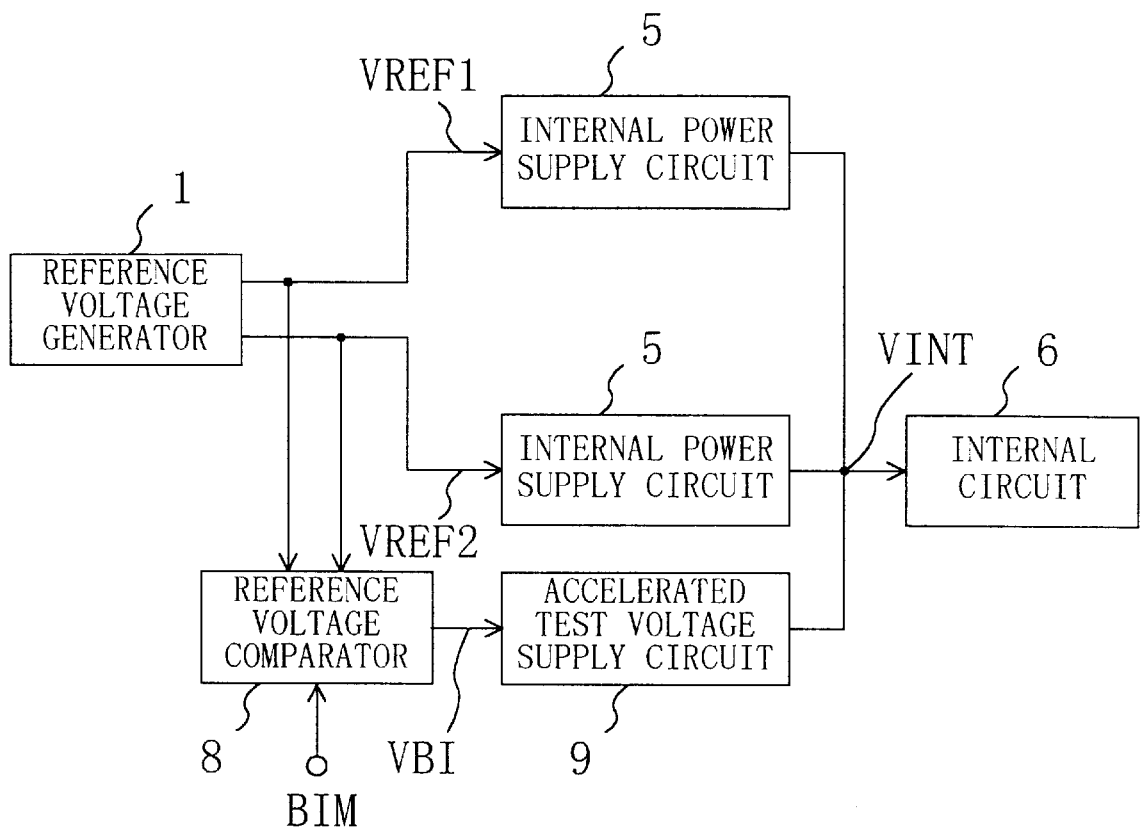
FIG. 1 is a block diagram of a semiconductor integrated circuit in the first embodiment of the present invention.

Hereinafter, preferred embodiments of the present invention will be described with reference to the accompanying drawings, in which the same reference numerals or reference signs denote the same components or signals all through the following embodiments.

Embodiment 1

Figure 2:
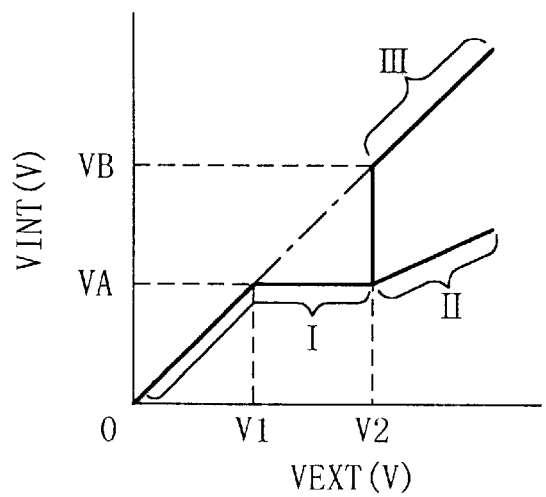
FIG. 2 is a graph illustrating the voltage characteristics of the semiconductor integrated circuit of the first embodiment.

FIG. 1 is a block diagram of a semiconductor integrated circuit in the first embodiment of the present invention. In FIG. 1, an internal circuit and the configuration of an internal voltage step down circuit for supplying a stepped down internal power supply voltage to the internal circuit are illustrated by blocks. FIG. 2 is a graph illustrating the voltage characteristics of the semiconductor integrated circuit shown in FIG. 1.

In FIG. 1, the reference numeral 1 denotes a reference voltage generator; 5 denotes first and second internal power supply circuits; 6 denotes an internal circuit; 8 denotes a reference voltage comparator; and 9 denotes an accelerated test voltage supply circuit. The reference signs VREF1 and VREF2 denote reference voltages generated by the reference voltage generator 1; BIM denotes an accelerated test control signal for activating the reference voltage comparator 8 during the accelerated test; VBI denotes an output signal of the reference voltage comparator 8; and VINT denotes an internal power supply voltage for driving the internal circuit 6.

The specific configuration of the semiconductor integrated circuit of the first embodiment having such a construction will be described, while referring to the operation thereof.

Figure 21A:
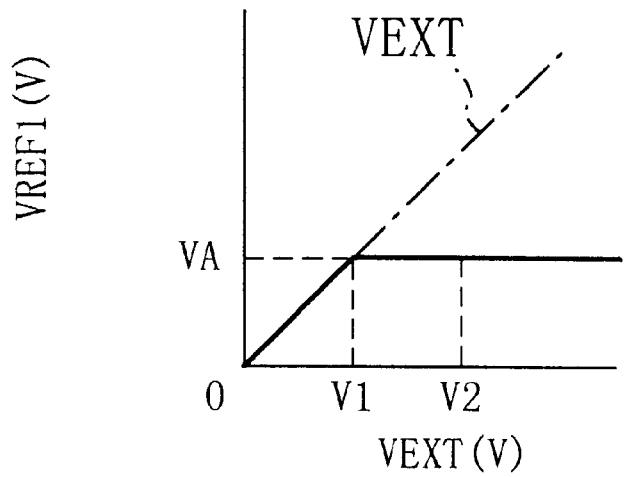
FIG. 21A is a graph illustrating the first reference voltage characteristics of the internal voltage step down circuit of the semiconductor integrated circuit in the first embodiment of the present invention.
Figure 21B:
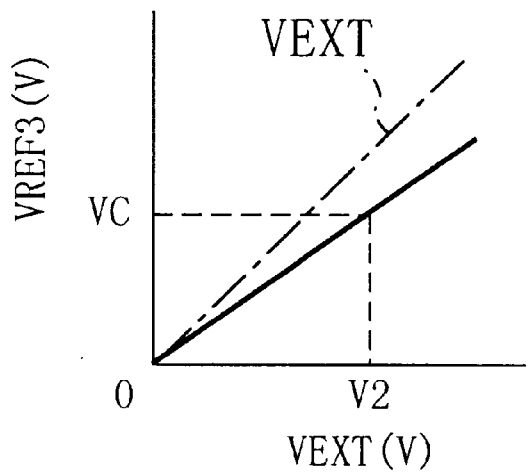
FIG. 21B is a graph illustrating the second reference voltage characteristics of the internal voltage step down circuit.
Figure 21C:
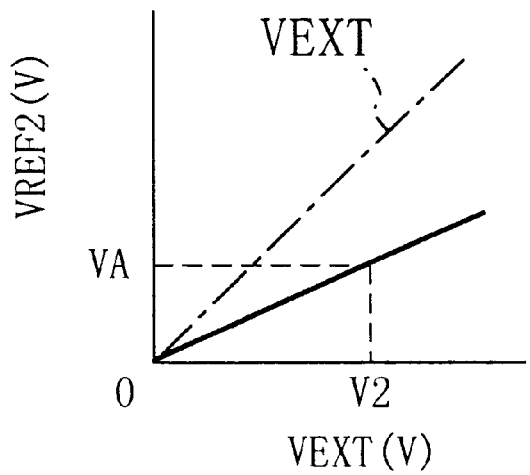
FIG. 21C is a graph illustrating the third reference voltage characteristics of the internal voltage step down circuit.
Figure 22:
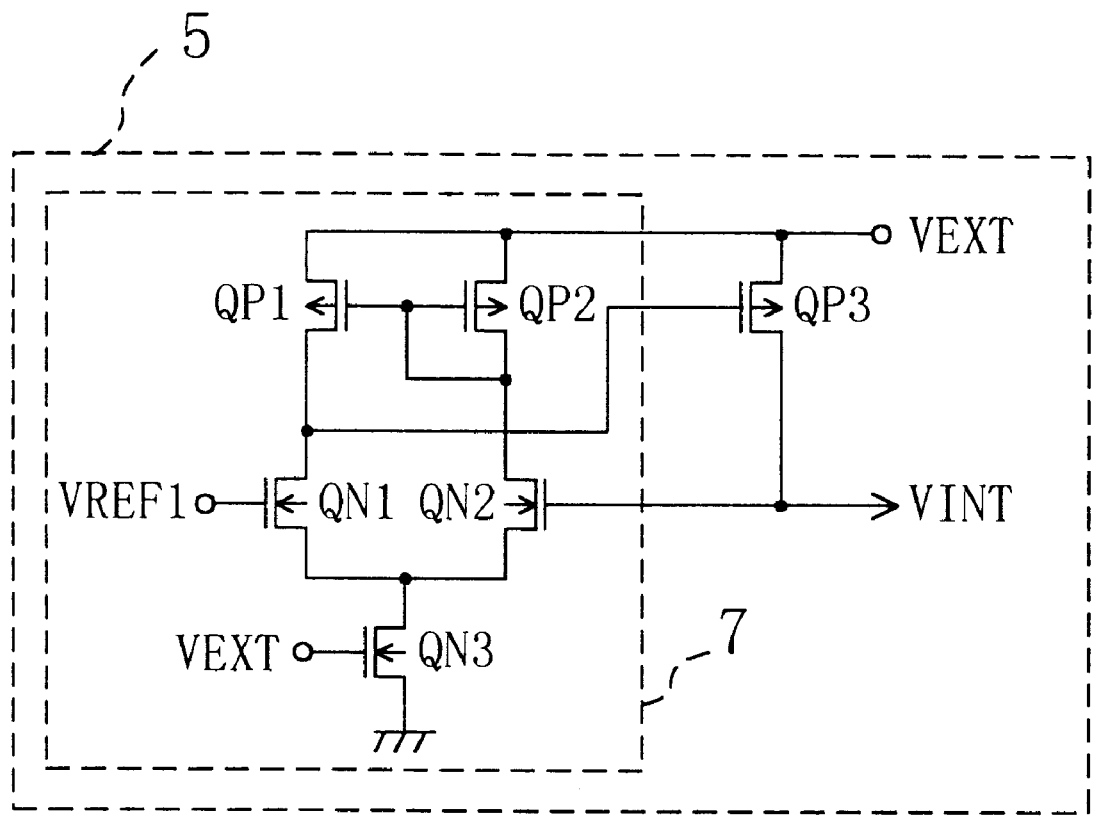
FIG. 22 is a circuit diagram illustrating a configuration of a conventional internal power supply circuit.

The reference voltage generator 1 generates a plurality of reference voltages VREF1 and VREF2. As shown in FIG. 21A, one reference voltage VREF1 generated (first reference voltage) exhibits characteristics having substantially no dependence on the external power supply voltage VEXT in which the reference voltage VREF1 is constant at VA on and after the external power supply voltage VEXT reaches the predetermined value V1. On the other hand, as shown in FIG. 21C, the other reference voltage VREF2 generated (second reference voltage) is equal to the reference voltage VA when the external power supply voltage VEXT is equal to the predetermined value V2 and then goes on rising in proportion to the external power supply voltage VEXT.

First, during the non-accelerated test, neither the reference voltage comparator 8 nor the accelerated test voltage supply circuit 9 on the next stage is activated in response to the accelerated test control signal BIM. Thus, based on one of the two types of reference voltages VREF1 and VREF2 generated by the reference voltage generator 1 that is the higher one with respect to the external power supply voltage VEXT, the first or second internal power supply circuit 5, receiving the higher reference voltage, outputs the internal power supply voltage VINT for driving the internal circuit 6. That is to say, if the external power supply voltage VEXT is smaller than the predetermined value V2, the internal power supply voltage VINT is generated in accordance with the characteristics shown in FIG. 21A. On the other hand, on and after the external power supply voltage VEXT reaches the predetermined value V2, the internal power supply voltage VINT is generated in accordance with the characteristics shown in FIG. 21C. During the non-accelerated test, the voltage characteristics of the internal power supply voltage VINT with respect to the external power supply voltage VEXT are represented by a characteristic line I (first voltage characteristic; exhibited if VEXT<V2) and a characteristic line II (second voltage characteristic; exhibited if VEXT≧V2) as shown in FIG. 2.

Next, during the accelerated test, the reference voltage comparator 8 is activated in response to the accelerated test control signal BIM. The reference voltage comparator 8 compares the two types of reference voltages VREF1 and VREF2, generated by the reference voltage generator 1, with each other. If it is determined that the reference voltage VREF2 is higher than the reference voltage VREF1, the reference voltage comparator 8 provides the output signal VBI to the accelerated test voltage supply circuit 9 on the next stage, thereby activating the circuit 9 and equalizing the internal power supply voltage VINT with the external power supply voltage VEXT. That is to say, if the external power supply voltage VEXT is within a voltage range in which the second reference voltage VREF2 is higher than the first reference voltage VREF1 (i.e., if VEXT≧V2), the internal power supply voltage VINT becomes equal to the external power supply voltage VEXT. On the other hand, if the external power supply voltage VEXT is smaller than the predetermined value V2, the first or second internal power supply circuit 5 outputs the internal power supply voltage VINT in the same way as in the non-accelerated test. During the accelerated test, the voltage characteristics of the internal power supply voltage VINT with respect to the external power supply voltage VEXT are represented by the characteristic line I (first voltage characteristic; exhibited if VEXT<V2) and a characteristic line III (third voltage characteristic; exhibited if VEXT≧V2) as shown in FIG. 2.

That is to say, respectively different internal power supply voltages can be generated during the accelerated test and during the non-accelerated test.

Figure 5:
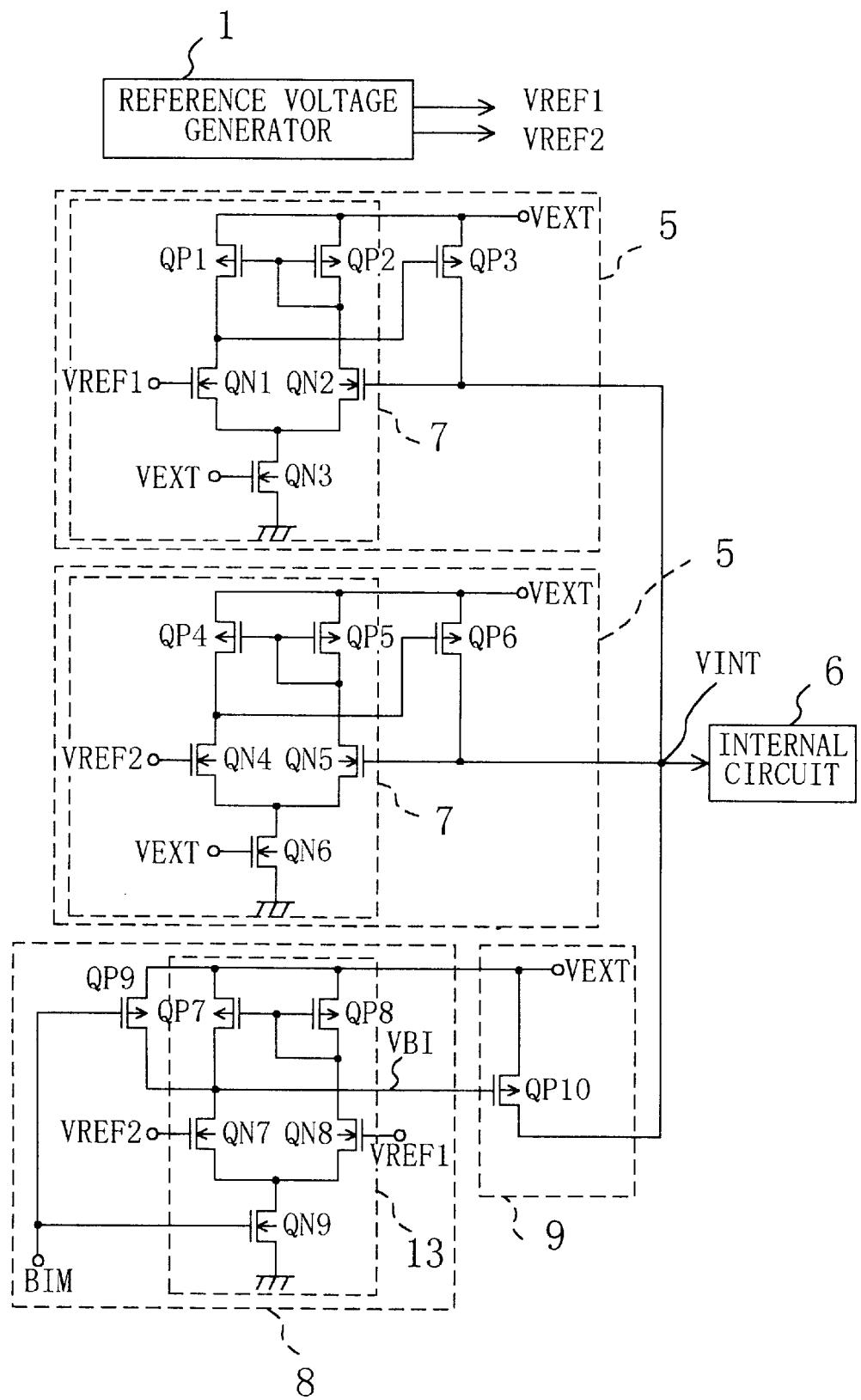
FIG. 5 is a circuit diagram illustrating a specific configuration of the semiconductor integrated circuit in the first embodiment of the present invention.

FIG. 5 illustrates a specific configuration of the semiconductor integrated circuit shown in FIG. 1 in the first embodiment of the present invention.

In FIG. 5, the reference signs QP1 through QP10 denote P-type MOS transistors and QN1 through QN9 denote N-type MOS transistors; and VEXT denotes an external power supply voltage. In FIG. 5, the components having the same functions as those of the counterparts in FIG. 1 and FIGS. 19A through 19C are identified by the same reference numerals.

The reference voltage generator 1 generates two types of reference voltages VREF1 and VREF2 and outputs these voltages to the first and second internal power supply circuits 5 and the reference voltage comparator 8.

The first internal power supply circuit 5, which receives the reference voltage VREF1, includes: a differential amplifier 7 including P-type MOS transistors QP1, QP2 and N-type MOS transistors QN1 through QN3; and a P-type MOS transistor (internal voltage supplying driver) QP3, which receives the output of the differential amplifier 7 at the gate terminal thereof. The drain voltage of the P-type MOS transistor QP3 is output as a first internal power supply voltage VINT1.

The second internal power supply circuit 5, which receives the reference voltage VREF2, includes: a differential amplifier 7 including P-type MOS transistors QP4, QP5 and N-type MOS transistors QN4 through QN6; and a P-type MOS transistor (internal voltage supplying driver) QP6, which receives the output of the differential amplifier 7 at the gate terminal thereof. The drain voltage of the P-type MOS transistor QP6 is output as a second internal power supply voltage VINT2.

The reference voltage comparator 8, which receives both the reference voltages VREF1 and VREF2, includes: a differential amplifier 13 including P-type MOS transistors QP7, QP8 and N-type MOS transistors QN7 to QN9; and a P-type MOS transistor QP9 connected in parallel to the P-type MOS transistor QP7 of the differential amplifier 13. The accelerated test control signal BIM is input to the gate terminal of the P-type MOS transistor QP9 and the gate terminal of the N-type MOS transistor QN9. The output signal VBI of the differential amplifier 13 is output to the accelerated test voltage supply circuit 9. The accelerated test voltage supply circuit 9 is constituted by a P-type MOS transistor QP10, which receives the output signal VBI at the gate terminal thereof, and outputs the drain voltage as a third internal power supply voltage VINT3.

Hereinafter, the operation of the semiconductor integrated circuit of the first embodiment having the above-described configuration will be described.

The two types of reference voltages VREF1 and VREF2 generated by the reference voltage generator 1 have the above-described characteristics. Specifically, as shown in FIG. 21A, the reference voltage VREF1 is constant at VA on and after the external power supply voltage VEXT reaches the predetermined value V1. On the other hand, as shown in FIG. 21C, the reference voltage VREF2 is equal to the reference voltage VA when the external power supply voltage VEXT is equal to the predetermined value V2 and then goes on rising in proportion to the external power supply voltage VEXT.

First, during the non-accelerated test, since the accelerated test control signal BIM is low, the N-type MOS transistor QN9, receiving this signal at the gate terminal thereof, is turned OFF and the differential amplifier 13 in the reference voltage comparator 8 is deactivated. On the other hand, since the P-type MOS transistor QP9, also receiving this signal at the gate terminal thereof, is turned ON, the output signal VBI of the differential amplifier 13 is forced to be high. Thus, since the P-type MOS transistor QP10, receiving the output signal VBI at the gate terminal thereof, is also turned OFF, the internal power supply voltage VINT is not affected by the accelerated test voltage supply circuit 9. The first internal power supply circuit 5, which receives the reference voltage VREF1 as an input, includes: the differential amplifier 7; and the P-type MOS transistor QP3 receiving the output of the differential amplifier 7 at the gate terminal thereof. The second internal power supply circuit 5, which receives the reference voltage VREF2 as an input, also has the same circuit configuration. The detailed operation of the first and second internal power supply circuits 5 has already been described in the "Background" section and thus the description thereof will be omitted herein.

Assume a case where the external power supply voltage VEXT is within a voltage range in which the reference voltage VREF1 is higher than the reference voltage VREF2 (i.e., VEXT<V2). In such a case, the first internal power supply circuit 5, which receives the reference voltage VREF1 as an input, outputs a voltage equal to the reference voltage VREF1 as the first internal power supply voltage VINT1. In the same way, the second internal power supply circuit 5, which receives the reference voltage VREF2 as an input, tries to output a voltage equal to the reference voltage VREF2 as the second internal power supply voltage VINT2.

However, since the reference voltage VREF1 is higher than the reference voltage VREF2, the internal power supply voltage VINT to be generated becomes equal to the first internal power supply voltage VINT1 generated by the first internal power supply circuit 5 receiving the reference voltage VREF1 as an input (i.e., VINT=VINT1). Conversely, if the external power supply voltage VEXT is within a voltage range in which the reference voltage VREF2 is higher than the reference voltage VREF1 (i.e., VEXT≧V2), the second internal power supply voltage VINT2 generated by the second internal power supply circuit 5 receiving the reference voltage VREF2 as an input is taken (i.e., VINT=VINT2).

Thus, during the non-accelerated test, the voltage characteristics of the internal power supply voltage VINT with respect to the external power supply voltage VEXT are represented by the characteristic line I (exhibited if VEXT<V2) and the characteristic line II (exhibited if VEXT≧V2) as shown in FIG. 2.

Next, during the accelerated test, since the accelerated test control signal BIM is high, the P-type MOS transistor QP9, receiving this signal at the gate terminal thereof, is turned OFF and the differential amplifier 13 in the reference voltage comparator 8 is activated. The differential amplifier 13 compares the reference voltages VREF1 and VREF2 with each other. If it is determined that the reference voltage VREF1 is higher than the reference voltage VREF2 (i.e., if VEXT<V2), the differential amplifier 13 output a high-level signal as the output signal VBI. As a result, the P-type MOS transistor QP10, which constitutes the accelerated test voltage supply circuit 9 on the next stage, is turned OFF. Thus, since the third internal power supply voltage VINT3 is not affected by the accelerated test voltage supply circuit 9, the value of the third internal power supply voltage VINT3 to be generated becomes equal to the value obtained when the external power supply voltage VEXT is smaller than the predetermined value V2 during the non-accelerated test (i.e., VINT=VINT3=VINT1).

Conversely, if the external power supply voltage VEXT is within a voltage range in which the reference voltage VREF2 is higher than the reference voltage VREF1 (if VEXT≧V2), the output signal VBI becomes low, and thus the P-type MOS transistor QP10 on the next stage is turned ON. As a result, the value of the third internal power supply voltage VINT3 generated by the accelerated test voltage supply circuit 9 is forced to be equal to that of the external power supply voltage VEXT (i.e., VINT=VINT3=VEXT).

Thus, during the accelerated test, the voltage characteristics of the internal power supply voltage VINT with respect to the external power supply voltage VEXT are represented by the characteristic line I (exhibited if VEXT<V2) and the characteristic line III (exhibited if VEXT≧V2) as shown in FIG. 2.

That is to say, it is possible to generate respectively different internal power supply voltages during the accelerated test and during the non-accelerated test.

Embodiment 2

Figure 3:
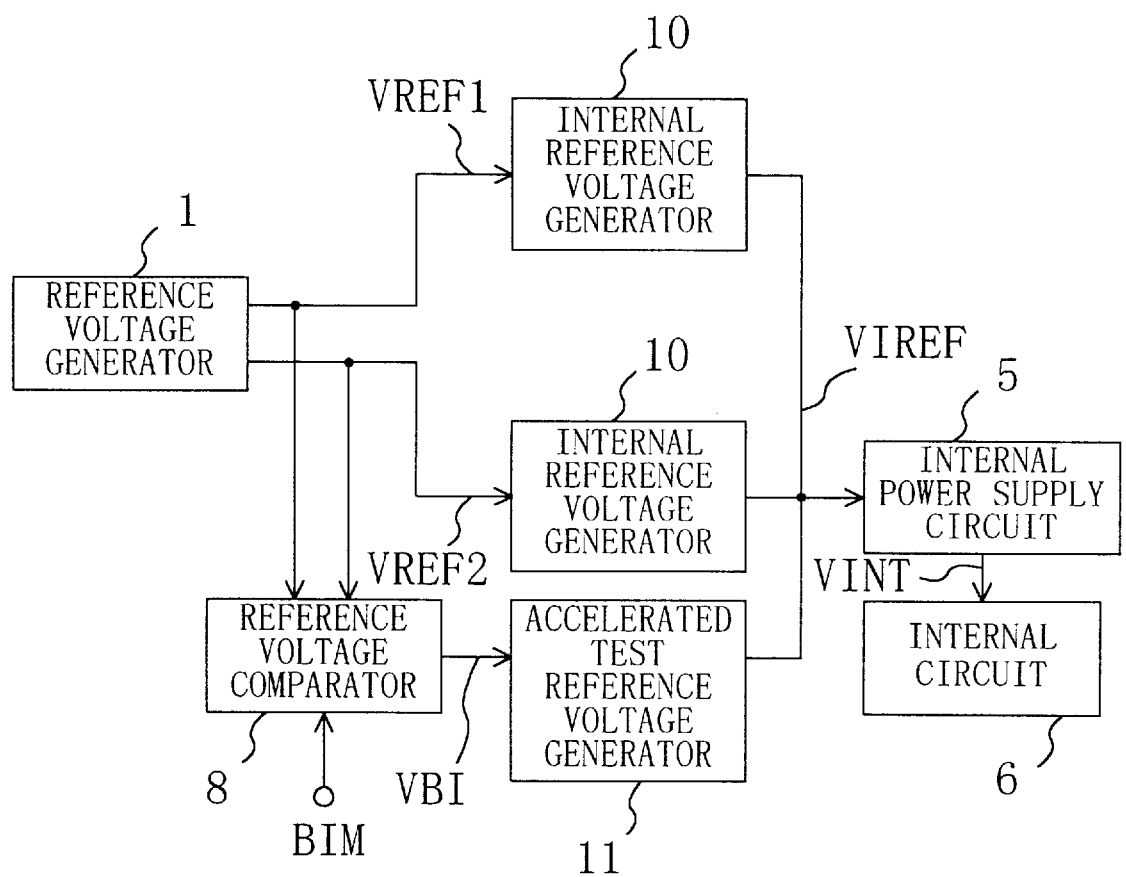
FIG. 3 is a block diagram of a semiconductor integrated circuit in the second embodiment of the present invention.
Figure 4A:
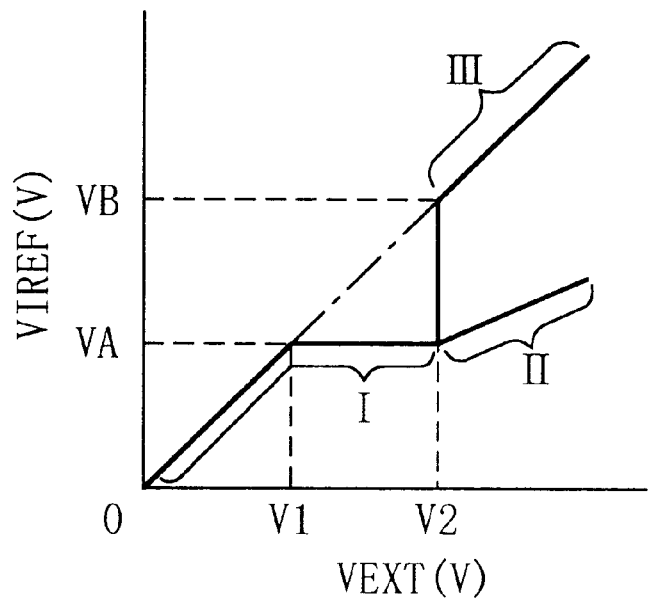
FIG. 4A is a graph illustrating the characteristics of the internal reference voltage with respect to the external power supply voltage in the semiconductor integrated circuit of the second embodiment.
Figure 4B:
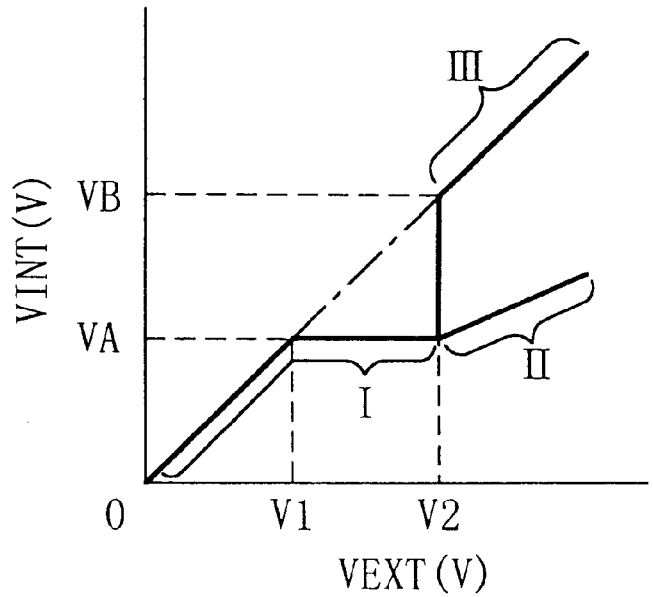
FIG. 4B is a graph illustrating the characteristics of the internal power supply voltage with respect to the external power supply voltage in the semiconductor integrated circuit of the second embodiment.

FIG. 3 is a block diagram of a semiconductor integrated circuit in the second embodiment of the present invention. In FIG. 3, an internal circuit and the configuration of an internal voltage step down circuit for supplying a stepped down internal power supply voltage to the internal circuit are illustrated by blocks. FIGS. 4A and 4B are graphs illustrating the voltage characteristics of the semiconductor integrated circuit shown in FIG. 3.

In FIG. 3, the reference numeral 10 denotes first and second internal reference voltage generators and 11 denotes an accelerated test reference voltage generator, and the reference sign VIREF denotes an internal reference voltage.

Hereinafter, a specific configuration of the semiconductor integrated circuit of the second embodiment having such a construction will be described, while referring to the operation thereof.

The reference voltage generator 1 generates a plurality of reference voltages VREF1 and VREF2. As shown in FIG. 21A, one reference voltage VREF1 generated (first reference voltage) exhibits characteristics having substantially no dependence on the external power supply voltage VEXT in which the reference voltage VREF1 is constant at VA on and after the external power supply voltage VEXT reaches the predetermined value V1. On the other hand, as shown in FIG. 21C, the other reference voltage VREF2 generated (second reference voltage) is equal to the reference voltage VA when the external power supply voltage VEXT is equal to the predetermined value V2 and then goes on rising in proportion to the external power supply voltage.

First, during the non-accelerated test, neither the reference voltage comparator 8 nor the accelerated test reference voltage generator 11 on the next stage is activated in response to the accelerated test control signal BIM. Thus, based on one of the two types of reference voltages VREF1 and VREF2 generated by the reference voltage generator 1 that is the higher one with respect to the external power supply voltage VEXT, the first or second internal power supply circuit 10, which receives the higher reference voltage, outputs the internal reference voltage VIREF. That is to say, if the external power supply voltage VEXT is smaller than the predetermined value V2, the internal reference voltage VIREF is generated in accordance with the characteristics shown in FIG. 21A. On the other hand, if the external power supply voltage VEXT is equal to or larger than the predetermined value V2, the internal reference voltage VIREF is generated in accordance with the characteristics shown in FIG. 21C.

During the non-accelerated test, the voltage characteristics of the internal reference voltage VIREF with respect to the external power supply voltage VEXT are represented by a characteristic line I (exhibited if VEXT<V2) and a characteristic line II (exhibited if VEXT≧V2) as shown in FIG. 4A. Then, based on the generated internal reference voltage VIREF, the internal power supply circuit 5 generates an internal power supply voltage VINT for driving the internal circuit 6. Thus, during the non-accelerated test, the voltage characteristics of the internal power supply voltage VINT with respect to the external power supply voltage VEXT are also represented as shown in FIG. 4B by the characteristic line I (first voltage characteristic) and the characteristic line II (second voltage characteristic) in the same way as in FIG. 4A.

Next, during the accelerated test, the reference voltage comparator 8 is activated in response to the accelerated test control signal BIM. The reference voltage comparator 8 compares the two types of reference voltages VREF1 and VREF2, generated by the reference voltage generator 1, with each other. If it is determined that the reference voltage VREF2 is higher than the reference voltage VREF1, the reference voltage comparator 8 provides the output signal VBI to the accelerated test reference voltage generator 11 on the next stage, thereby activating the circuit 11 and equalizing the internal reference voltage VIREF with the external power supply voltage VEXT. That is to say, if the external power supply voltage VEXT is within a voltage range in which the second reference voltage VREF2 is higher than the first reference voltage VREF1 (i.e., if VEXT≧V2), the internal reference voltage VIREF becomes equal to the external power supply voltage VEXT. On the other hand, if the external power supply voltage VEXT is smaller than the predetermined value V2, the internal reference voltage generator 10 outputs the internal reference voltage VIREF in the same way as in the non-accelerated test. During the accelerated test, the voltage characteristics of the internal reference voltage VIREF with respect to the external power supply voltage VEXT are represented by the characteristic line I (exhibited if VEXT<V2) and a characteristic line III (exhibited if VEXT≧V2) as shown in FIG. 4A. Then, based on the internal reference voltage generated VIREF, the internal power supply circuit 5 generates an internal power supply voltage VINT for driving the internal circuit 6.

Thus, during the accelerated test, the voltage characteristics of the internal power supply voltage VINT with respect to the external power supply voltage VEXT are also represented as shown in FIG. 4B by the characteristic line I (first voltage characteristic) and the characteristic line III (third voltage characteristic) in the same way as in FIG. 4A.

That is to say, respectively different internal power supply voltages can be generated during the accelerated test and during the non-accelerated test.

Figure 6:
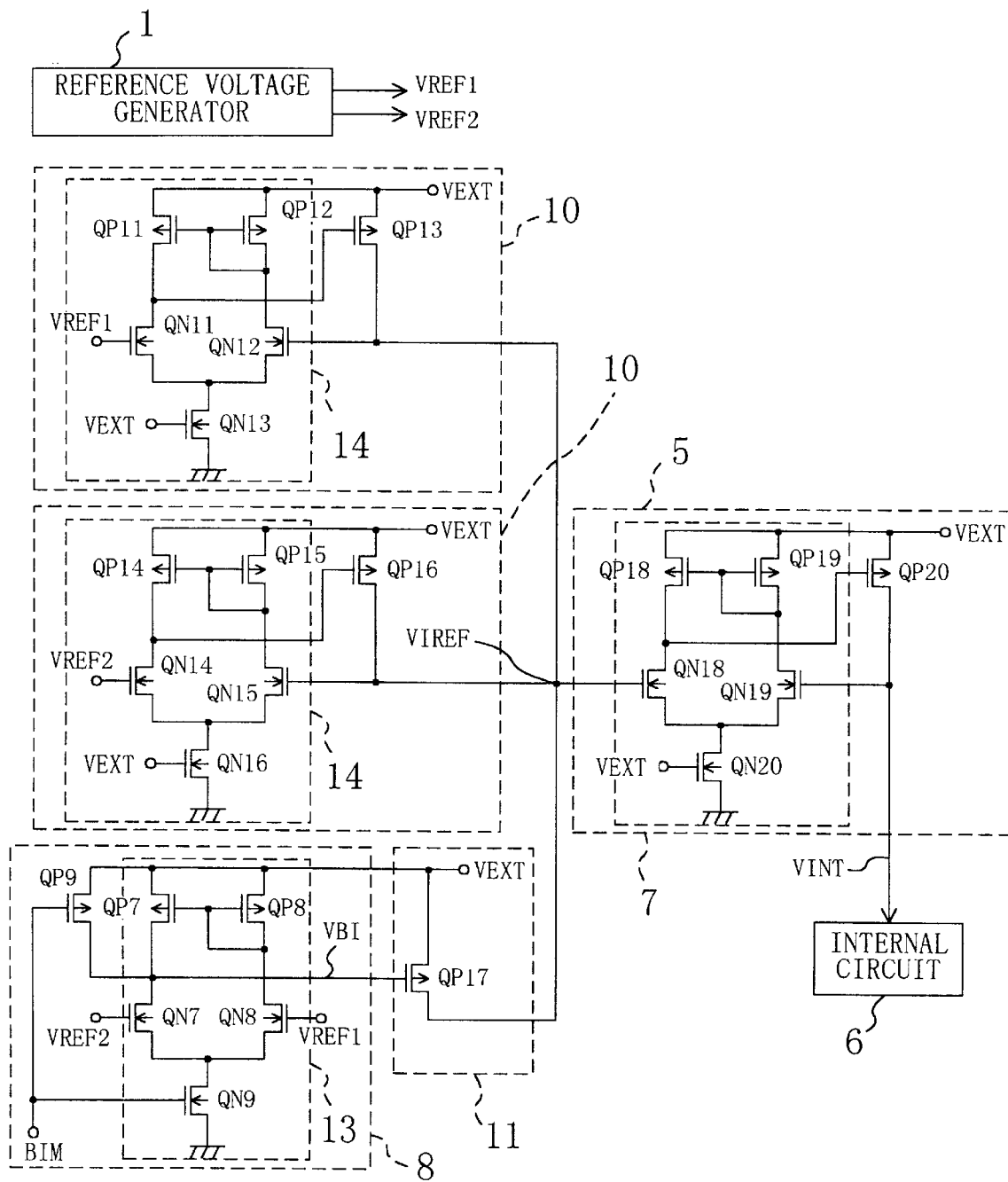
FIG. 6 is a circuit diagram illustrating a specific configuration of the semiconductor integrated circuit in the second embodiment of the present invention.

FIG. 6 illustrates a specific configuration of the semiconductor integrated circuit shown in FIG. 3 in the second embodiment of the present invention.

In FIG. 6, the reference signs QP11 through QP20 denote P-type MOS transistors; and QN11 through QN16 and QN18 through QN20 denote N-type MOS transistors. In FIG. 6, the components having the same functions as those of the counterparts in FIG. 3 and FIGS. 19A through 19C are identified by the same reference numerals.

The reference voltage generator 1 generates two types of reference voltages VREF1 and VREF2 and outputs these voltages to the first and second internal reference voltage generators 10 and the reference voltage comparator 8.

The first internal reference voltage generator 10, which receives the first reference voltage VREF1, includes: a differential amplifier 14 including P-type MOS transistors QP11, QP12 and N-type MOS transistors QN11 through QN13; and a P-type MOS transistor (internal reference voltage generating driver) QP13, which receives the output of the differential amplifier 14 at the gate terminal thereof. The drain voltage of the P-type MOS transistor QP13 is output as a first internal reference voltage VIREF1.

The second internal reference voltage generator 10, which receives the second reference voltage VREF2, includes: a differential amplifier 14 including P-type MOS transistors QP14, QP15 and N-type MOS transistors QN14 through QN16; and a P-type MOS transistor (internal reference voltage generating driver) QP16, which receives the output of the differential amplifier 14 at the gate terminal thereof. The drain voltage of the P-type MOS transistor QP16 is output as a second internal reference voltage VIREF2. The reference voltage comparator 8, which receives both the reference voltages VREF1 and VREF2, includes: a differential amplifier 13 including P-type MOS transistors QP7, QP8 and N-type MOS transistors QN7 through QN9; and a P-type MOS transistor QP9 connected in parallel to the P-type MOS transistor QP7 of the differential amplifier 13. The accelerated test control signal BIM is input to the gate terminal of the P-type MOS transistor QP9 and the gate terminal of the N-type MOS transistor QN9. The output signal VBI of the differential amplifier 13 is output to the accelerated test reference voltage generator 11.

The accelerated test reference voltage generator 11 is constituted by a P-type MOS transistor QP17, which receives the output signal VBI at the gate terminal thereof, and outputs the drain voltage as a third internal reference voltage VIREF3.

The internal power supply circuit 5, which receives the internal reference voltage VIREF, includes: a differential amplifier 7 including P-type MOS transistors QP18, QP19 and N-type MOS transistors QN18 through QN20; and a P-type MOS transistor QP20, which receives the output of the differential amplifier 7 at the gate terminal thereof. The drain voltage of the P-type MOS transistor QP20 is output as the internal power supply voltage VINT.

Hereinafter, the operation of the semiconductor integrated circuit of the second embodiment having the above-described configuration will be described.

The two types of reference voltages VREF1 and VREF2 generated by the reference voltage generator 1 have the same characteristics as those described in the first embodiment. Specifically, as shown in FIG. 21A, the reference voltage VREF1 is constant at VA on and after the external power supply voltage VEXT reaches the predetermined value V1. On the other hand, as shown in FIG. 21C, the reference voltage VREF2 is equal to the reference voltage VA when the external power supply voltage VEXT is equal to the predetermined value V2 and then goes on rising in proportion to the external power supply voltage VEXT.

First, during the non-accelerated test, since the accelerated test control signal BIM is low, the N-type MOS transistor QN9, receiving this signal at the gate terminal thereof, is turned OFF and the differential amplifier 13 in the reference voltage comparator 8 is deactivated. On the other hand, since the P-type MOS transistor QP9, also receiving this signal at the gate terminal thereof, is turned ON, the output signal VBI of the differential amplifier 13 is forced to be high. Thus, since the P-type MOS transistor QP17, receiving the output signal VBI at the gate terminal thereof, is also turned OFF, the internal reference voltage VIREF3 is not affected by the accelerated test reference voltage generator 11. The first internal reference voltage generator 10, which receives the reference voltage VREF1 as an input, includes: the differential amplifier 14; and the P-type MOS transistor QP13 receiving the output of the differential amplifier 14 at the gate terminal thereof. The second internal reference voltage generator 10, which receives the reference voltage VREF2 as an input, also has the same circuit configuration. The configurations of these circuits 10 are the same as that of the first internal power supply circuit 5 receiving the reference voltage VREF1 and that of the second internal power supply circuit 5 receiving the reference voltage VREF2 of the first embodiment, respectively.

Thus, during the non-accelerated test, the voltage characteristics of the internal reference voltage VIREF are represented by the characteristic line I (exhibited if VEXT<V2) and the characteristic line II (exhibited if VEXT≧V2) as shown in FIG. 4A.

Next, during the accelerated test, since the accelerated test control signal BIM is high, the P-type MOS transistor QP9, receiving this signal at the gate terminal thereof, is turned OFF and the differential amplifier 13 in the reference voltage comparator 8 is activated. The differential amplifier 13 compares the reference voltages VREF1 and VREF2 with each other. If it is determined that the reference voltage VREF1 is higher than the reference voltage VREF2 (if VEXT<V2), the differential amplifier 13 outputs a high-level signal as the output signal VBI. As a result, the P-type MOS transistor QP17, which constitutes the accelerated test reference voltage generator 11 on the next stage, is turned OFF. Thus, since the third internal reference voltage VIREF3 is not affected by the accelerated test reference voltage generator 11, the value of the internal reference voltage VIREF generated becomes equal to the value obtained when the external power supply voltage VEXT is smaller than the predetermined value V2 during the non-accelerated test (i.e., VIREF=VIREF1=VIREF3). Conversely, if the external power supply voltage VEXT is within a voltage range in which the reference voltage VREF2 is higher than the reference voltage VREF1 (if VEXT≧V2), the output signal VBI becomes low, and thus the P-type MOS transistor QP17 on the next stage is turned ON.

As a result, the value of the internal reference voltage VIREF generated by the accelerated test reference voltage generator 11 is forced to be equal to that of the external power supply voltage VEXT (i.e., VIREF=VIREF3= VIREF2=VEXT). Thus, during the accelerated test, the voltage characteristics of the internal reference voltage VIREF with respect to the external power supply voltage VEXT are represented by the characteristic line I (exhibited if VEXT<V2) and the characteristic line III (exhibited if VEXT≧V2) as shown in FIG. 4A.

The internal power supply circuit 5 has the same circuit configuration as that of the circuit described in the "Background" section, and outputs a voltage equal to the received internal reference voltage VIREF as the internal power supply voltage VINT. Thus, the internal power supply voltage VINT generated has the voltage characteristics represented by the characteristic lines I and II during the non-accelerated test or by the characteristic lines I and III during the accelerated test as shown in FIG. 4B.

That is to say, by generating respectively different internal reference voltages during the accelerated test and during the non-accelerated test, it is possible to generate respectively different internal power supply voltages based on the internal reference voltages during the accelerated test and during the non-accelerated test.

Embodiment 3

Figure 7:
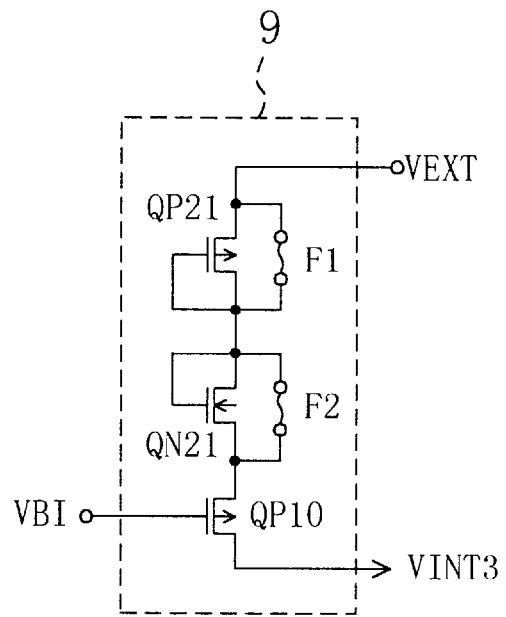
FIG. 7 is a circuit diagram illustrating a principal section of a semiconductor integrated circuit in the third embodiment of the present invention.

Next, a semiconductor integrated circuit in the third embodiment of the present invention will be described. Since the overall configuration of the third embodiment is the same as that of the first embodiment, only different parts therebetween will be described hereinafter. FIG. 7 is a circuit diagram illustrating a specific configuration of the accelerated test voltage supply circuit 9 shown in FIG. 5.

In the accelerated test voltage supply circuit 9 shown in FIG. 7, the reference sign QP21 denotes a P-type MOS transistor, QN21 denotes an N-type MOS transistor and F1 and F2 denote fuses. In FIG. 7, the N-type MOS transistor QN21 having a diode-connected gate is serially connected to the source terminal of the P-type MOS transistor QP10 constituting the accelerated test voltage supply circuit 9 shown in FIG. 5. The P-type MOS transistor QP21 having a diode-connected gate is serially connected to the N-type MOS transistor QN21. And fuses F1 and F2 are respectively connected in parallel to the transistors QP21 and QN21. The threshold voltages of the P-type MOS transistor and the N-type MOS transistor will be identified by VTP and VTN, respectively. The other configurations are the same as those of FIG. 5. Thus, the same parts are identified by the same reference numerals and the description thereof will be omitted herein.

Hereinafter, the operation of the semiconductor integrated circuit of the third embodiment having the above-described configuration will be described.

As described in the first embodiment, the P-type MOS transistor QP10 is turned ON during the accelerated test and when the reference voltage VREF2 is higher than the reference voltage VREF1. If the fuses F1 and F2 are not disconnected, the voltage at the source terminal of the P-type MOS transistor QP10 is equal to the external power supply voltage VEXT. Thus, the voltage characteristics of the internal power supply voltage VINT are represented by the characteristic line III as described in the first embodiment with reference to FIG. 2.

Figure 8:
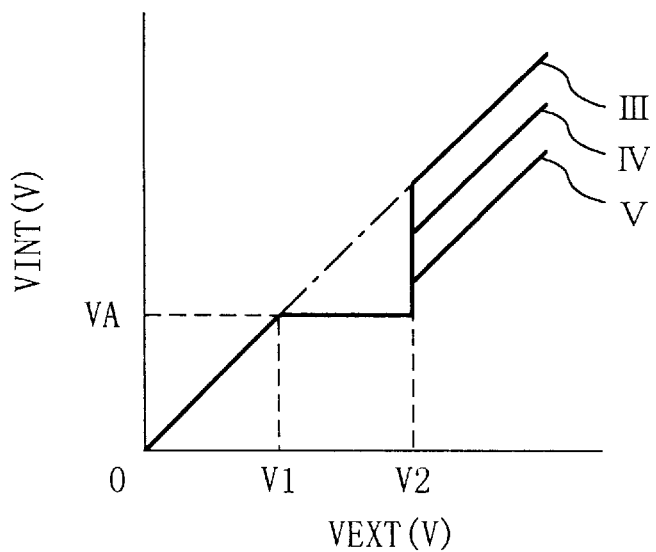
FIG. 8 is a graph illustrating the voltage characteristics of the semiconductor integrated circuit of the third embodiment.

If the fuse F1 is disconnected, then the P-type MOS transistor QP21 is serially connected to the P-type MOS transistor QP10. Thus, during the accelerated test, if the external power supply voltage VEXT is within a voltage range in which the reference voltage VREF2 is higher than the reference voltage VREF1, the internal power supply voltage VINT can be lower than the external power supply voltage VEXT by the threshold voltage VTP of the P-type MOS transistor as represented by a characteristic line IV shown in FIG. 8.

Similarly, if the fuse F2 is disconnected, then the N-type MOS transistor QN21 is serially connected to the P-type MOS transistor QP10. Thus, the internal power supply voltage VINT can be lower than the external power supply voltage VEXT by the threshold voltage VTN of the N-type MOS transistor as represented by a characteristic line V shown in FIG. 8. It is noted that if the N-type MOS transistor QN21 is formed by implanting the same impurity as that implanted into a memory cell transistor, then the internal power supply voltage VINT can be lower than the external power supply voltage VEXT by the threshold voltage of the memory cell transistor. Also, even when the serially connected transistors are shuffled in their order, the same effects can be attained.

As can be understood, during the accelerated test, the characteristics of the internal power supply voltage can be easily modified. Thus, the rise rate of the voltage applied to an internal circuit can be accelerated more flexibly during the accelerated test.

Embodiment 4

Figure 9:
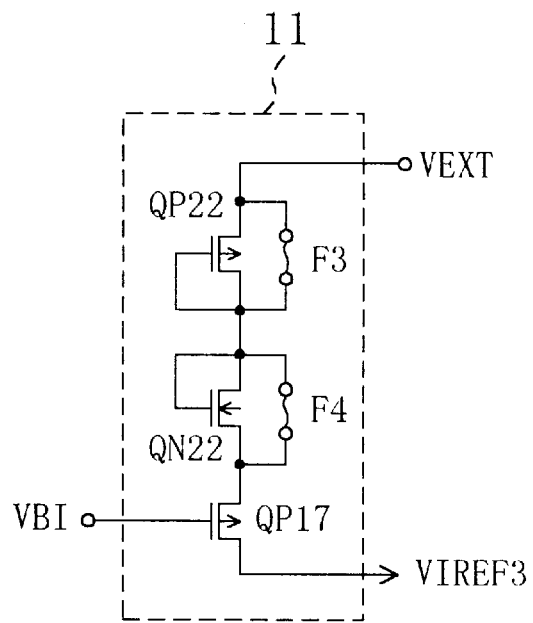
FIG. 9 is a circuit diagram illustrating a principal section of a semiconductor integrated circuit in the fourth embodiment of the present invention.

Next, a semiconductor integrated circuit in the fourth embodiment of the present invention will be described. Since the overall configuration of the fourth embodiment is the same as that of the second embodiment, only different parts therebetween will be described hereinafter. FIG. 9 is a circuit diagram illustrating a specific configuration of the accelerated test reference voltage generator 11 shown in FIG. 6.

In the accelerated test reference voltage generator 11 shown in FIG. 9, the reference sign QP22 denotes a P-type MOS transistor, QN22 denotes an N-type MOS transistor and F3 and F4 denote fuses. In FIG. 9, the N-type MOS transistor QN22 having a diode-connected gate is serially connected to the source terminal of the P-type MOS transistor QP17 constituting the accelerated test reference voltage generator 11 shown in FIG. 6. The P-type MOS transistor QP22 having a diode-connected gate is serially connected to the N-type MOS transistor QN22. And the fuses F3 and F4 are respectively connected in parallel to the transistors QP22 and QN22. The threshold voltages of the P-type MOS transistor and the N-type MOS transistor will be identified by VTP and VTN, respectively. The other configurations are the same as those of FIG. 6. Thus, the same parts are identified by the same reference numerals and the description thereof will be omitted herein.

Hereinafter, the operation of the semiconductor integrated circuit of the fourth embodiment having the above-described configuration will be described.

As described in the second embodiment, the P-type MOS transistor QP17 is turned ON during the accelerated test and when the reference voltage VREF2 is higher than the reference voltage VREF1. If the fuses F3 and F4 are not disconnected, the voltage at the source terminal of the P-type MOS transistor QP17 is equal to the external power supply voltage VEXT. Thus, the voltage characteristics of the internal reference voltage VIREF are represented by the characteristic line III as described in the second embodiment with reference to FIG. 4A.

Figure 10:
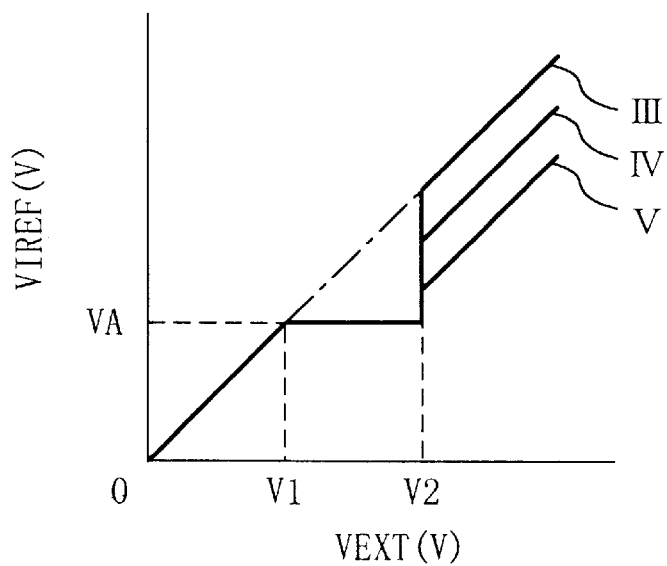
FIG. 10 is a graph illustrating the voltage characteristics of the semiconductor integrated circuit of the fourth embodiment.

If the fuse F3 is disconnected, then the P-type MOS transistor QP22 is serially connected to the P-type MOS transistor QP17. Thus, during the accelerated test, if the external power supply voltage VEXT is within a voltage range in which the reference voltage VREF2 is higher than the reference voltage VREF1, the internal reference voltage VIREF can be lower than the external power supply voltage VEXT by the threshold voltage VTP of the P-type MOS transistor as represented by a characteristic line IV shown in FIG. 10.

Similarly, if the fuse F4 is disconnected, then the N-type MOS transistor QN22 is serially connected to the P-type MOS transistor QP17. Thus, the internal reference voltage VIREF can be lower than the external power supply voltage VEXT by the threshold voltage VTN of the N-type MOS transistor as represented by a characteristic line V shown in FIG. 10.

It is noted that if the N-type MOS transistor QN22 is formed by implanting the same impurity as that implanted into a memory cell transistor, then the internal reference voltage VIREF can be lower than the external power supply voltage VEXT by the threshold voltage of the memory cell transistor. Also, even when the serially connected transistors are shuffled in their order, the same effects can be attained.

As can be understood, during the accelerated test, the characteristics of the internal reference voltage can be easily modified. Thus, the internal power supply voltage can also be easily modified and the rise rate of the voltage applied to an internal circuit can be accelerated more flexibly during the accelerated test.

Embodiment 5

Figure 11:
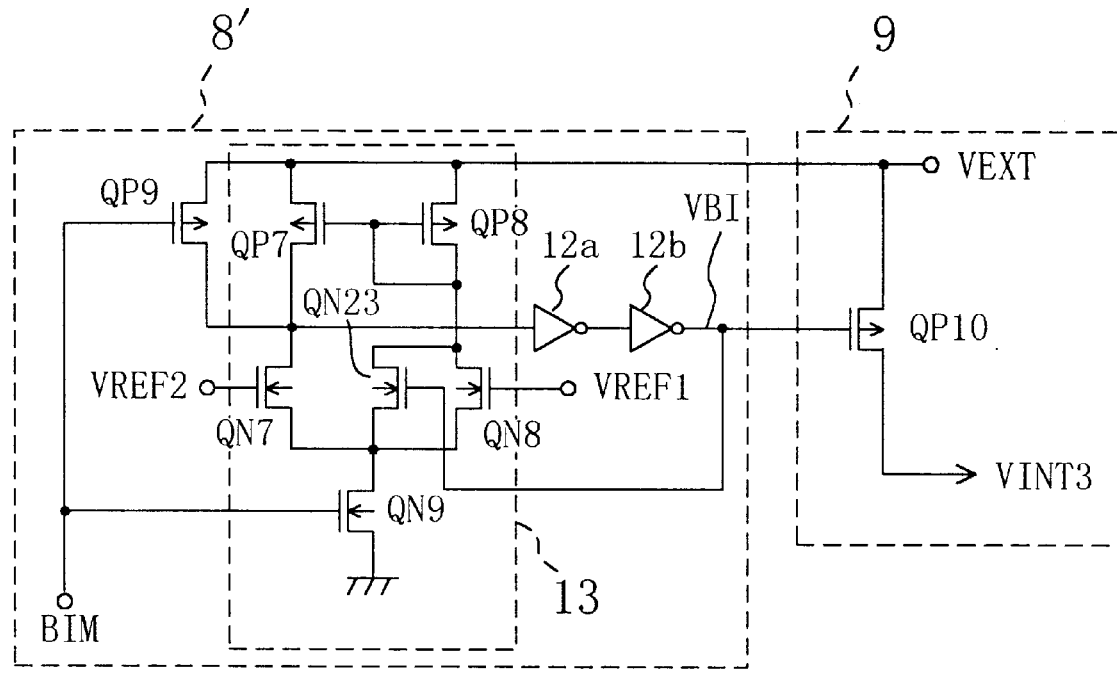
FIG. 11 is a circuit diagram illustrating a principal section of a semiconductor integrated circuit in the fifth embodiment of the present invention.

Next, a semiconductor integrated circuit in the fifth embodiment of the present invention will be described. Since the overall configuration of the fifth embodiment is the same as that of the first embodiment, only different parts therebetween will be described hereinafter. FIG. 11 is a circuit diagram illustrating a specific configuration of a reference voltage comparator 8', which is a variation of the reference voltage comparator 8 shown in FIG. 5.

In the reference voltage comparator 8' shown in FIG. 11, the reference numerals 12a and 12b denote inverters and QN23 denotes an N-type MOS transistor. In the comparator 8', the inverters 12a and 12b are connected between the output of the differential amplifier 13 in the reference voltage comparator 8 shown in FIG. 5 and the P-type MOS transistor QP10 constituting the accelerated test voltage supply circuit 9 on the next stage. The N-type MOS transistor QN23 is connected in parallel to the N-type MOS transistor QN8 receiving the first reference voltage VREF1 at the gate terminal thereof. The output of the inverter 12b is input to the gate terminal of the N-type MOS transistor QN23. The other configuration is the same as that of FIG. 5.

The operation of the semiconductor integrated circuit of the fifth embodiment having the above-described configuration will be described.

First, the output signal VBI of the inverter 12b is a signal that has been output from the differential amplifier 13 and then passed through the two stages of inverters and has the same polarity as that of the output of the differential amplifier 13. Thus, unless the N-type MOS transistor QN23 is provided, the internal power supply voltage has the same characteristics as those of the first embodiment.

Figure 12:
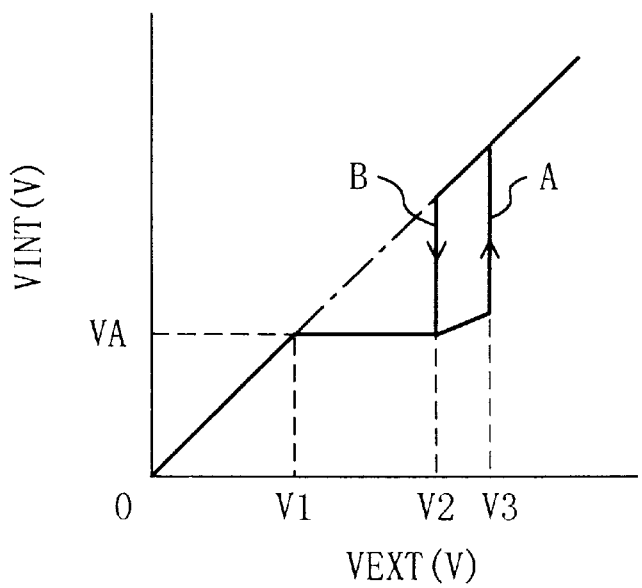
FIG. 12 is a graph illustrating the voltage characteristics of the semiconductor integrated circuit of the fifth embodiment.

Herein, the output signal VBI of the inverter 12b is assume to be positively fed back to the N-type MOS transistor QN23 connected in parallel to the N-type MOS transistor QN8 receiving the first reference voltage VREF1 at the gate terminal thereof. Then, the voltage characteristics of the internal power supply voltage VINT are represented as shown in FIG. 12. Specifically, if the external power supply voltage VEXT changes from a lower voltage into a higher voltage, the internal power supply voltage VINT can be represented by a characteristic line A. That is to say, unless the external power supply voltage VEXT is equal to or larger than V3, the output signal VBI does not becomes low. Conversely, if the external power supply voltage VEXT changes from a higher voltage into a lower voltage, no feedback is provided. This is because if the external power supply voltage VEXT is equal to or larger than V3, the output signal VBI is low, and the transistor QN23, receiving the output signal VBI at the gate terminal thereof, is turned OFF. As a result, the characteristics of the internal power supply voltage are represented by a characteristic line B (i.e., the same characteristics as those of the first embodiment).

By providing hysteresis characteristics ranging from the voltage V3 to the voltage V2, the internal power supply voltage can exhibit stable characteristics even if the external power supply voltage VEXT has varied in the vicinity of the predetermined value V2 because of power supply noise or the like during the accelerated test (i.e., while the accelerated test control signal BIM is high).

Embodiment 6

Figure 13:
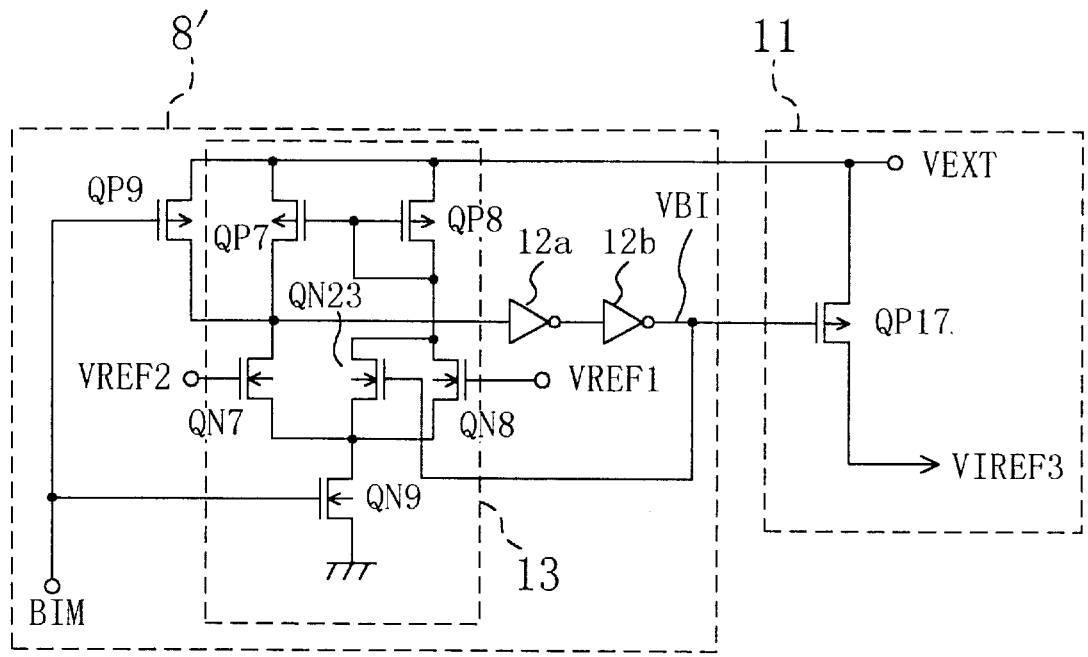
FIG. 13 is a circuit diagram illustrating a principal section of a semiconductor integrated circuit in the sixth embodiment of the present invention.

FIG. 13 is a circuit diagram illustrating a principal section of the semiconductor integrated circuit in the sixth embodiment of the present invention.

FIG. 13 illustrates a reference voltage comparator 8', which is a variation of the reference voltage comparator 8 of the semiconductor integrated circuit in the second embodiment shown in FIG. 6. In the reference voltage comparator 8', inverters 12a and 12b are connected between the output of the differential amplifier 13 in the reference voltage comparator 8 shown in FIG. 6 and the P-type MOS transistor QP17 constituting the accelerated test reference voltage generator 11 on the next stage. An N-type MOS transistor QN23 is connected in parallel to the N-type MOS transistor QN8 receiving the first reference voltage VREF1 at the gate terminal thereof. The output of the inverter 12b is input to the gate terminal of the N-type MOS transistor QN23. The other configuration is the same as that of FIG. 6.

The operation of the semiconductor integrated circuit of the sixth embodiment having the above-described configuration will be described.

First, the output signal VBI of the inverter 12b is a signal that has been output from the differential amplifier 13 and then passed through the two stages of inverters and has the same polarity as that of the output of the differential amplifier 13. Thus, unless the N-type MOS transistor QN23 is provided, the internal power supply voltage has the same characteristics as those of the first embodiment.

Figure 14:
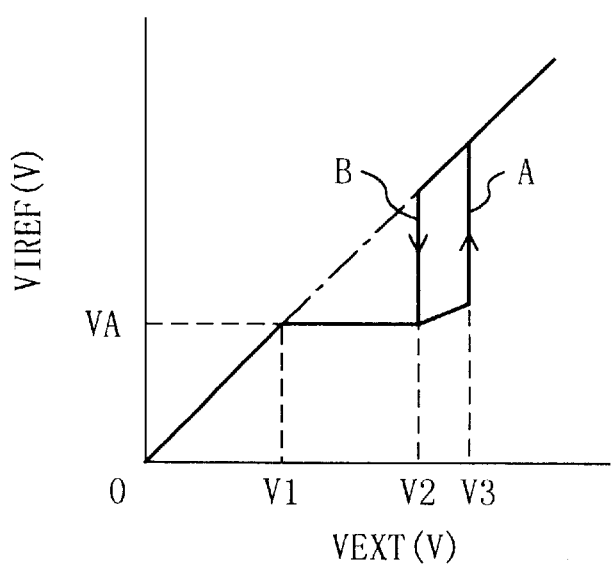
FIG. 14 is a graph illustrating the voltage characteristics of the semiconductor integrated circuit of the sixth embodiment.

Herein, the output signal VBI of the inverter 12b is assume to be positively fed back to the N-type MOS transistor QN23 connected in parallel to the N-type MOS transistor QN8 receiving the first reference voltage VREF1 at the gate terminal thereof. Then, the voltage characteristics of the internal reference voltage VIREF are represented as shown in FIG. 14. Specifically, if the external power supply voltage VEXT changes from a lower voltage into a higher voltage, the internal reference voltage VIREF can be represented by a characteristic line A. That is to say, unless the external power supply voltage VEXT is equal to or larger than V3, the output signal VBI does not becomes low. Conversely, if the external power supply voltage VEXT changes from a higher voltage into a lower voltage, no feedback is provided. This is because if the external power supply voltage VEXT is equal to or larger than V3, the output signal VBI is low, and the transistor QN23, receiving the output signal VBI at the gate terminal thereof, is turned OFF. As a result, the characteristics of the internal reference voltage are represented by a characteristic line B (i.e., the same characteristics as those of the second embodiment).

By providing hysteresis characteristics ranging from the voltage V3 to the voltage V2, the internal reference voltage can exhibit stable characteristics even if the external power supply voltage VEXT has varied in the vicinity of the predetermined value V2 because of power supply noise or the like during the accelerated test (i.e., while the accelerated test control signal BIM is high). Thus, the internal power supply voltage, generated based on the internal reference voltage, can also exhibit stable voltage characteristics. In an actual device, satisfactory internal power supply voltage characteristics can be attained by providing hysteresis characteristics of about 0.4 V.

Embodiment 7

Figure 15:
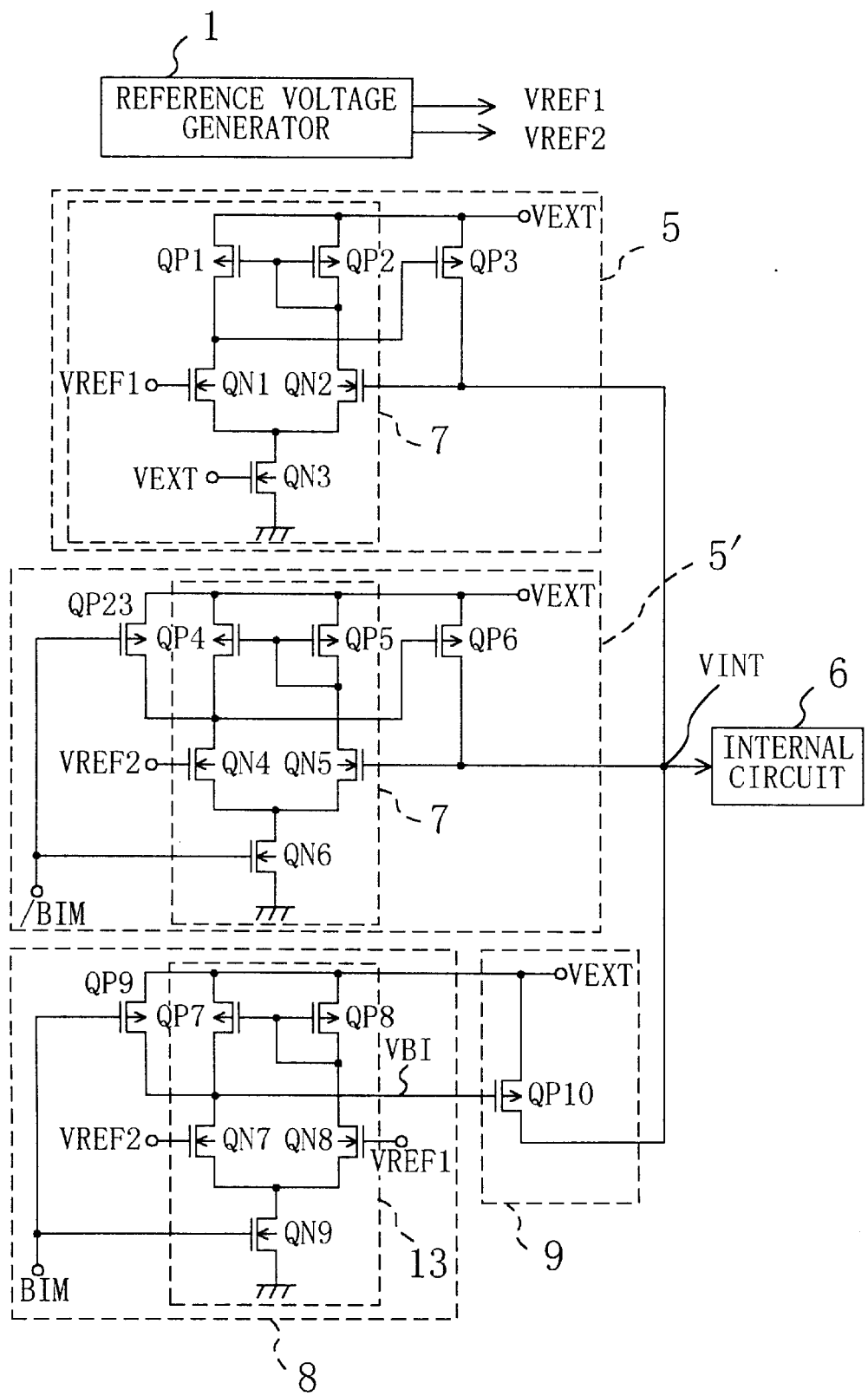
FIG. 15 is a circuit diagram illustrating a specific configuration of a semiconductor integrated circuit in the seventh embodiment of the present invention.

FIG. 15 is a circuit diagram of a semiconductor integrated circuit in the seventh embodiment of the present invention.

In a second internal power supply circuit 5' shown in FIG. 15, a P-type MOS transistor QP23 is connected in parallel to the P-type MOS transistor QP4 in the differential amplifier 7 of the second internal power supply circuit 5 receiving the second reference voltage VREF2 shown in FIG. 5. An inverted signal /BIM of the accelerated test control signal BIM is input to the gate terminal of the P-type MOS transistor QP23 and to the gate terminal of the N-type MOS transistor QN6 of the differential amplifier 7.

Hereinafter, the operation of the semiconductor integrated circuit of the seventh embodiment having the above-described configuration will be described.

First, during the non-accelerated test, since the accelerated test control signal BIM is low, the inverted signal thereof /BIM is high. The P-type MOS transistor QN23, receiving this signal /BIM at the gate terminal thereof, is turned OFF and the N-type MOS transistor QN6, also receiving this signal /BIM at the gate terminal thereof, is turned ON. Thus, the differential amplifier 7 in the second internal power supply circuit 5' receiving the second reference voltage VREF2 is activated. Thus, during the non-accelerated test, the same operation as that of the first embodiment is performed.

Next, during the accelerated test, since the accelerated test control signal BIM is high, the inverted signal thereof /BIM is low. As described in the first embodiment, the internal power supply voltage characteristics during the accelerated test are determined based on the voltage characteristics of the first internal power supply voltage VINT1 generated by the first internal power supply circuit 5 receiving the first reference voltage VREF1 if the external power supply voltage VEXT is smaller than the predetermined value V2. On the other hand, if the external power supply voltage VEXT is equal to or larger than the predetermined value V2, the internal power supply voltage characteristics during the accelerated test are determined based on the voltage characteristics of the third internal power supply voltage VINT3 generated by the reference voltage comparator 8 and the accelerated test voltage supply circuit 9. That is to say, the operation of the internal power supply circuit 5' receiving the second reference voltage VREF2 has nothing to do with the internal power supply voltage characteristics. Thus, there is no problem if the internal power supply circuit 5' receiving the second reference voltage VREF2 is deactivated by inputting the inverted signal /BIM of the accelerated test control signal BIM to the gate terminals of the P-type MOS transistor QP23 and the N-type MOS transistor QN6.

As can be understood, by deactivating the internal power supply circuit 5' receiving the second reference voltage VREF2 and thereby reducing the steady current flowing through the differential amplifier 7 during the accelerated test, the power consumption can be reduced.

Embodiment 8

Figure 16:
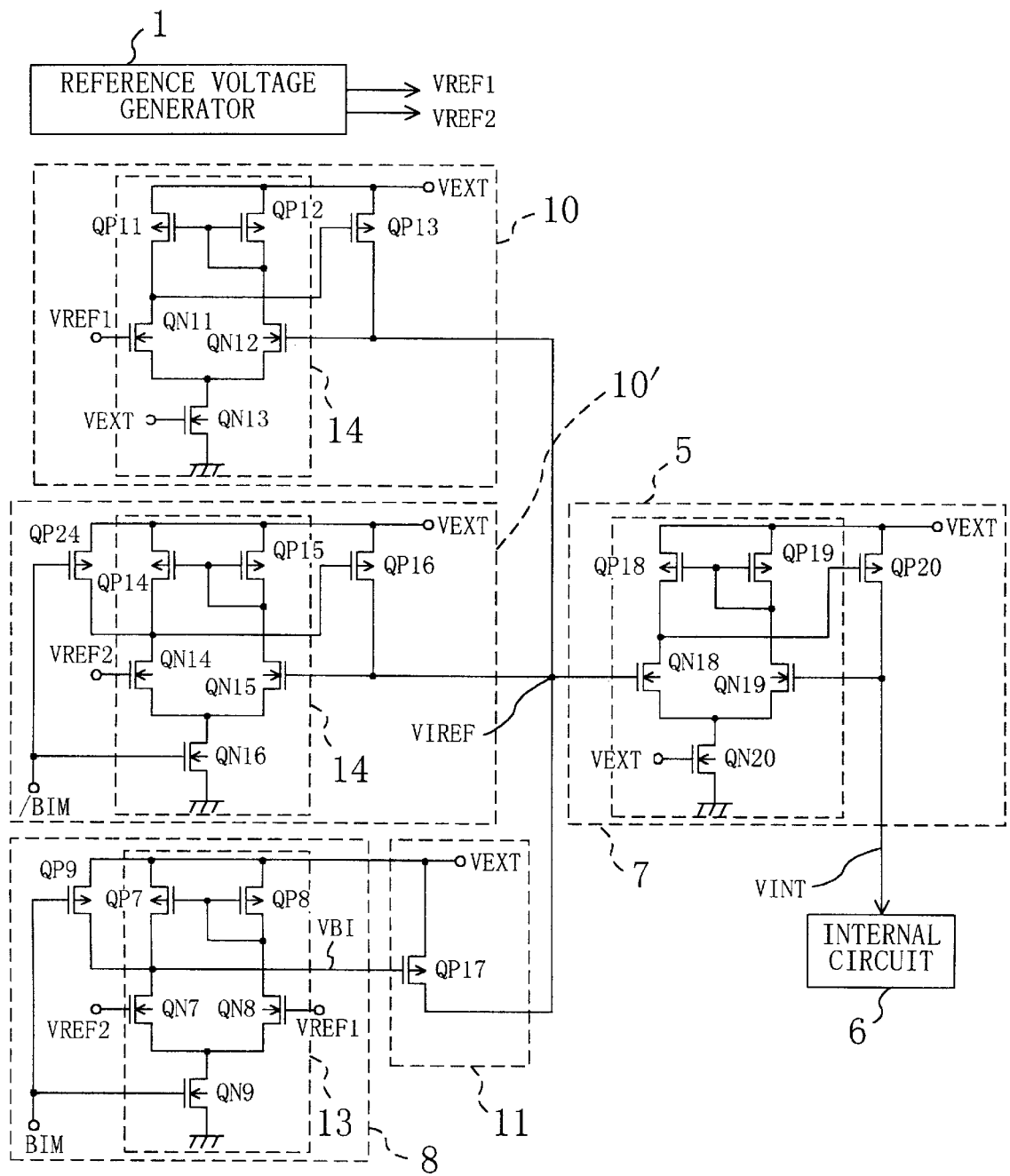
FIG. 16 is a circuit diagram illustrating a specific configuration of a semiconductor integrated circuit in the eighth embodiment of the present invention.

FIG. 16 is a circuit diagram of a semiconductor integrated circuit in the eighth embodiment of the present invention.

In a second internal reference voltage generator 10' shown in FIG. 16, a P-type MOS transistor QP24 is connected in parallel to the P-type MOS transistor QP14 in the differential amplifier 14 of the second internal reference voltage generator 10 receiving the second reference voltage VREF2 shown in FIG. 6. An inverted signal /BIM of the accelerated test control signal BIM is input to the gate terminal of the P-type MOS transistor QP24 and to the gate terminal of the N-type MOS transistor QN16 of the differential amplifier 14. The other configuration is the same as that of FIG. 6.

Hereinafter, the operation of the semiconductor integrated circuit of the eighth embodiment having the above-described configuration will be described.

First, during the non-accelerated test, since the accelerated test control signal BIM is low, the inverted signal thereof /BIM is high. The P-type MOS transistor QN24, receiving this signal /BIM at the gate terminal thereof, is turned OFF and the N-type MOS transistor QN16, also receiving this signal /BIM at the gate terminal thereof, is turned ON. Thus, the differential amplifier 14 in the second internal reference voltage generator 10' receiving the second reference voltage VREF2 is activated. As a result, during the non-accelerated test, the same operation as that of the second embodiment is performed.

Next, during the accelerated test, since the accelerated test control signal BIM is high, the inverted signal thereof /BIM is low. As described in the second embodiment, the internal reference voltage characteristics during the accelerated test are determined based on the voltage characteristics of the first internal reference voltage VIREF1 generated by the first internal reference voltage generator 10 receiving the first reference voltage VREF1 if the external power supply voltage VEXT is smaller than the predetermined value V2. On the other hand, if the external power supply voltage VEXT is equal to or larger than the predetermined value V2, the internal reference voltage characteristics during the accelerated test are determined based on the voltage characteristics of the third internal reference voltage VIREF3 generated by the reference voltage comparator 8 and the accelerated test reference voltage generator 11. That is to say, the operation of the second internal reference voltage generator 10' receiving the second reference voltage VREF2 has nothing to do with the internal reference voltage characteristics. Thus, there is no problem if the second internal reference voltage generator 10' receiving the second reference voltage VREF2 is deactivated by inputting the inverted signal /BIM of the accelerated test control signal BIM to the gate terminals of the P-type MOS transistor QP24 and the N-type MOS transistor QN16.

As can be understood, by deactivating the second internal reference voltage generator 10' receiving the second reference voltage VREF2 and thereby reducing the steady current flowing through the differential amplifier 14 during the accelerated test, the power consumption can be reduced.

Embodiment 9

Figure 17:
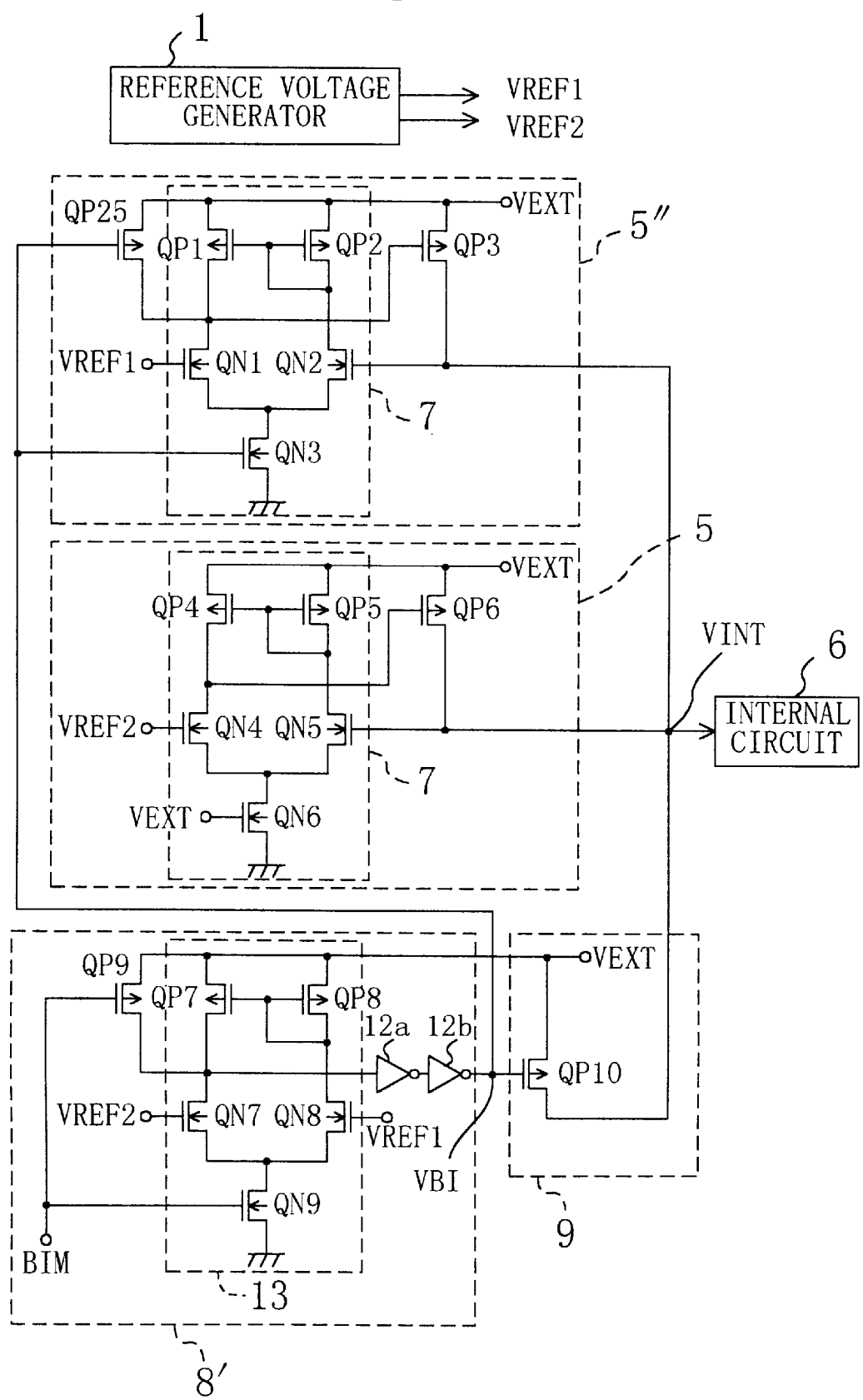
FIG. 17 is a circuit diagram illustrating a specific configuration of a semiconductor integrated circuit in the ninth embodiment of the present invention.

FIG. 17 is a circuit diagram of a semiconductor integrated circuit in the ninth embodiment of the present invention.

In a reference voltage comparator 8' shown in FIG. 17, the inverters 12a and 12b are connected between the output of the differential amplifier 13 in the reference voltage comparator 8 shown in FIG. 5 and the P-type MOS transistor QP10 constituting the accelerated test voltage supply circuit 9 on the next stage. Also, in a first internal power supply circuit 5" shown in FIG. 17, a P-type MOS transistor QP25 is connected in parallel to the P-type MOS transistor QP1 in the differential amplifier 7 of the first internal power supply circuit 5 receiving the first reference voltage VREF1 shown in FIG. 5. The output signal of the inverter 12b is input to the gate terminal of the P-type MOS transistor QP25 and to the gate terminal of the N-type MOS transistor QN3 of the differential amplifier 7. The other configuration is the same as that of FIG. 5.

Hereinafter, the operation of the semiconductor integrated circuit of the ninth embodiment having the above-described configuration will be described.

First, during the non-accelerated test, since the accelerated test control signal BIM is low, the differential amplifier 13 in the reference voltage comparator 8' is deactivated, as described in the first embodiment. The output signal VBI of the inverter 12b is a signal that has been output from the differential amplifier 13 of the reference voltage comparator 8' and then passed through the two stages of inverters and has the same polarity as that of the output of the differential amplifier 13. Thus, the output signal VBI becomes high. Accordingly, the P-type MOS transistor QP25, receiving the output signal VBI at the gate terminal thereof, is turned OFF and the N-type MOS transistor QN3, also receiving the output signal VBI at the gate terminal thereof, is turned ON. As a result, the differential amplifier 7 in the first internal power supply circuit 5" receiving the first reference voltage VREF1 is activated. Accordingly, during the non-accelerated test, the same operation as that of the first embodiment is performed.

Next, during the accelerated test, the characteristics of the internal power supply voltage VINT are determined based on the voltage characteristics of the first internal power supply voltage VINT1 generated by the first internal power supply circuit 5 receiving the first reference voltage VREF1 if the external power supply voltage is within a voltage range in which the first reference voltage VREF1 is higher than the second reference voltage VREF2 (i.e., VEXT<V2) as described in the first embodiment. On the other hand, if the external power supply voltage is within a voltage range in which the second reference voltage VREF2 is higher than the first reference voltage VREF1 (i.e., VEXT≧V2), the internal power supply voltage characteristics during the accelerated test are determined based on the voltage characteristics of the third internal power supply voltage VINT3 generated by the reference voltage comparator 8' and the accelerated test voltage supply circuit 9. That is to say, the operation of the first internal power supply circuit 5" receiving the first reference voltage VREF1 has nothing to do with the internal power supply voltage characteristics if the external power supply voltage is within a voltage range in which the second reference voltage VREF2 is higher than the first reference voltage VREF1. During the accelerated test, if the external power supply voltage is within a voltage range in which the first reference voltage VREF1 is higher than the second reference voltage VREF2, the output signal VBI of the inverter 12b is high. On the other hand, if the external power supply voltage is within a voltage range in which the second reference voltage VREF2 is higher than the first reference voltage VREF1, the output signal VBI of the inverter 12b is low. Accordingly, the first internal power supply circuit 5" receiving the first reference voltage VREF1 is activated if the external power supply voltage VEXT is smaller than the predetermined value V2 and is deactivated if the external power supply voltage VEXT is equal to or larger than the predetermined value V2.

By deactivating the first internal power supply circuit 5" receiving the first reference voltage VREF1 if the external power supply voltage is within a voltage range in which the second reference voltage VREF2 is higher than the first reference voltage VREF1 and thereby reducing the steady current flowing through the differential amplifier 7 during the accelerated test in this manner, the power consumption can be reduced.

Embodiment 10

Figure 18:
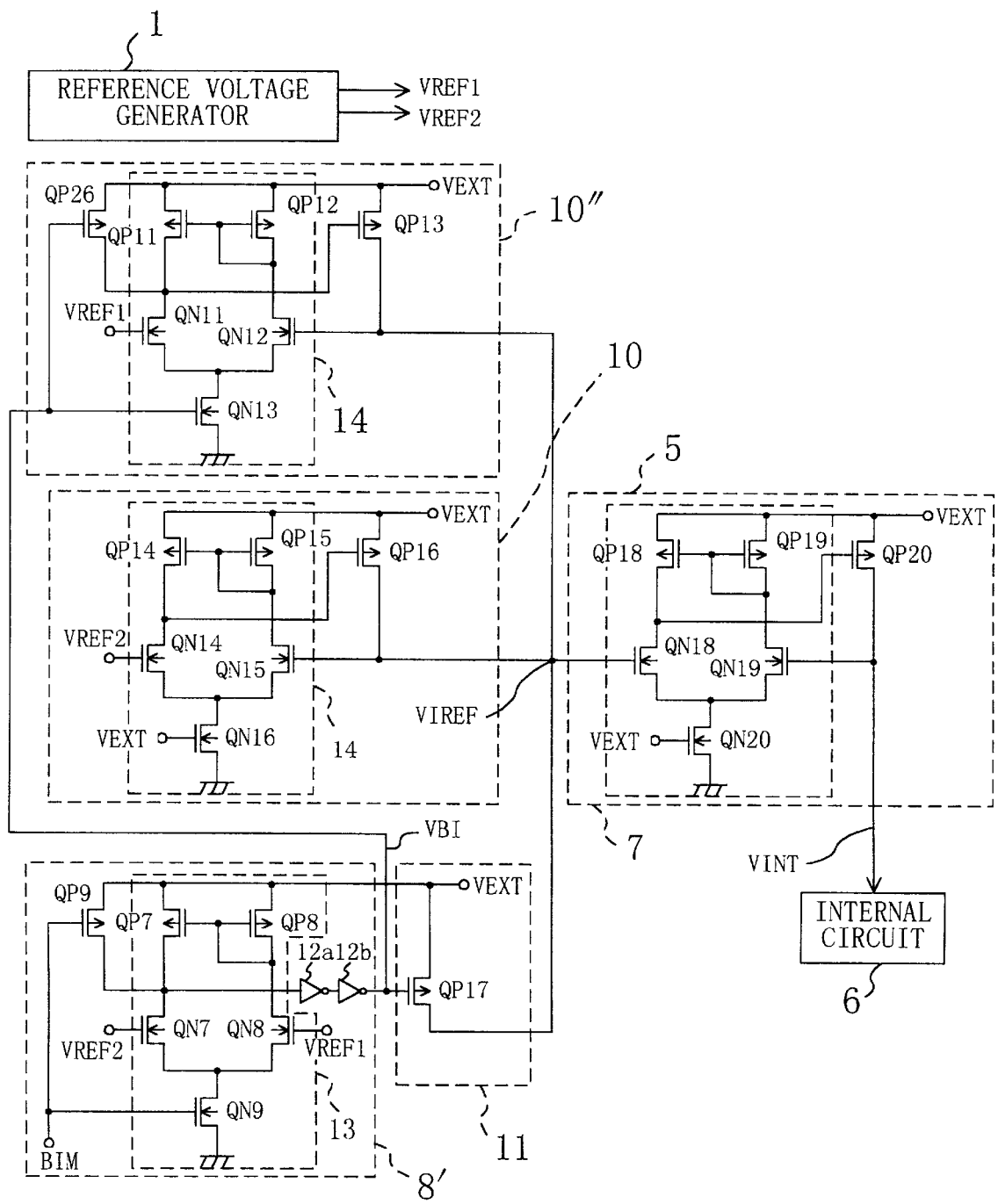
FIG. 18 is a circuit diagram illustrating a specific configuration of a semiconductor integrated circuit in the tenth embodiment of the present invention.
Figure 19A:
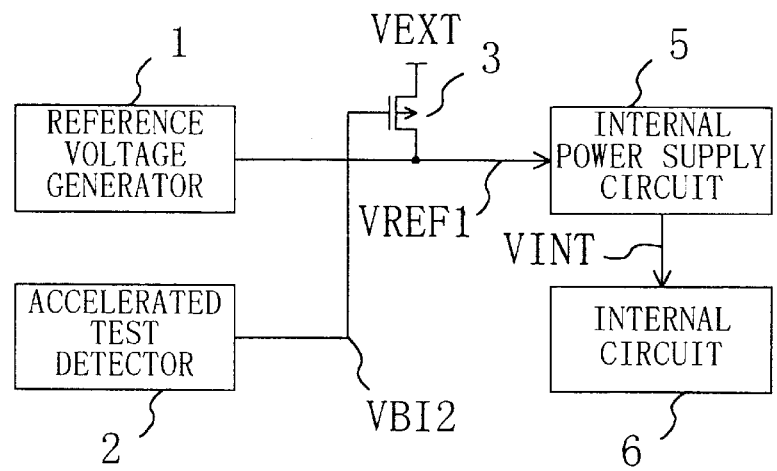
FIG. 19A is a block diagram illustrating an exemplary configuration of a conventional semiconductor integrated circuit.
Figure 19B:
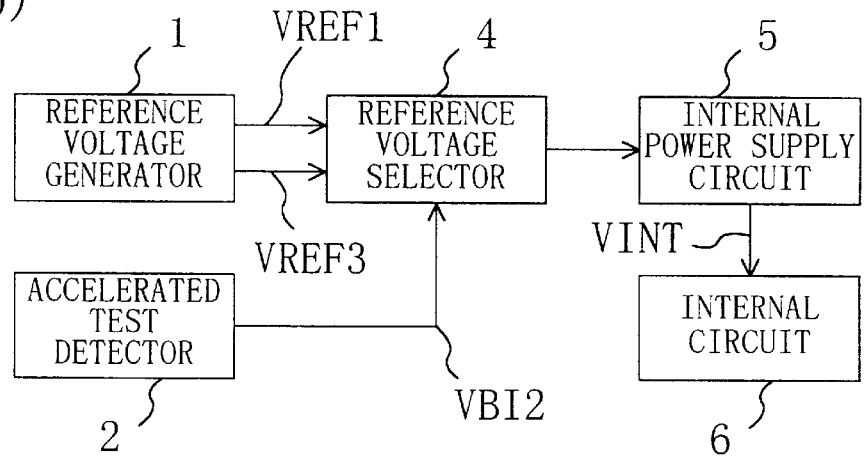
FIG. 19B is a block diagram illustrating another exemplary configuration of a conventional semiconductor integrated circuit.
Figure 19C:
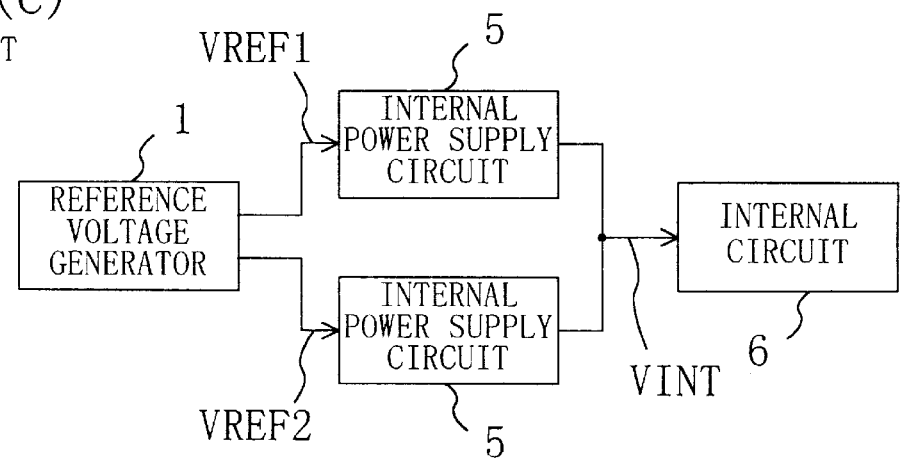
FIG. 19C is a block diagram illustrating still another exemplary configuration of a conventional semiconductor integrated circuit.
Figure 20A:
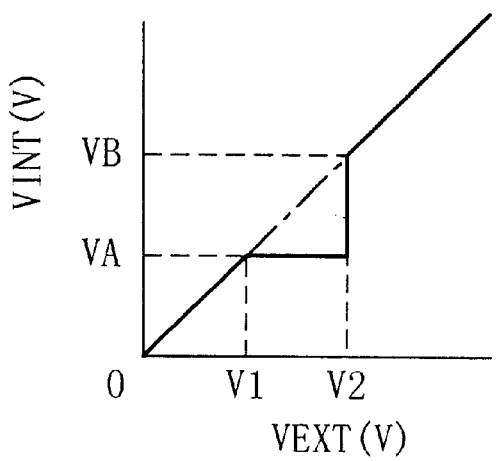
FIG. 20A is a graph illustrating the internal power supply voltage characteristics of the conventional semiconductor integrated circuit shown in FIG. 19A.
Figure 20B:
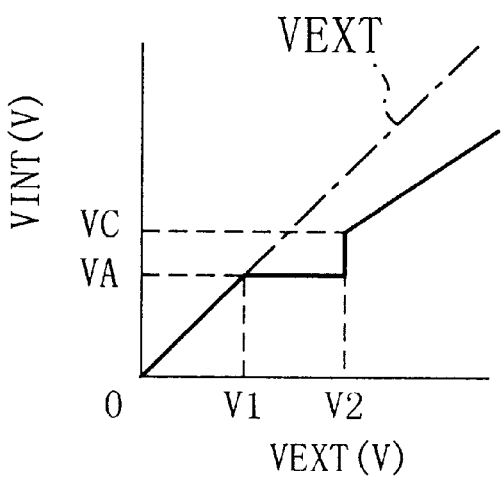
FIG. 20B is a graph illustrating the internal power supply voltage characteristics of the conventional semiconductor integrated circuit shown in FIG. 19B.
Figure 20C:
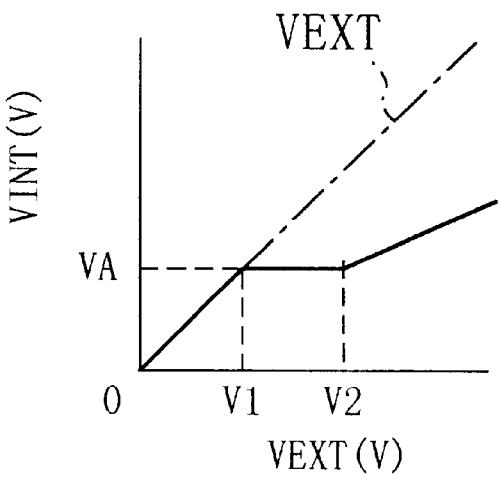
FIG. 20C is a graph illustrating the internal power supply voltage characteristics of the conventional semiconductor integrated circuit shown in FIG. 19C.

FIG. 18 is a circuit diagram of a semiconductor integrated circuit in the tenth embodiment of the present invention.

In a reference voltage comparator 8' shown in FIG. 18, the inverters 12a and 12b are connected between the output of the differential amplifier 13 in the reference voltage comparator 8 shown in FIG. 6 and the P-type MOS transistor QP17 constituting the accelerated test reference voltage generator 11 on the next stage. Also, in a first internal reference voltage generator 10" shown in FIG. 18, a P-type MOS transistor QP26 is connected in parallel to the P-type MOS transistor QP11 in the differential amplifier 14 of the first internal reference voltage generator 10 receiving the first reference voltage VREF1 shown in FIG. 6. The output signal VBI of the inverter 12b is input to the gate terminal of the P-type MOS transistor QP26 and to the gate terminal of the N-type MOS transistor QN13 of the differential amplifier 14. The other configuration is the same as that of FIG. 6.

Hereinafter, the operation of the semiconductor integrated circuit of the tenth embodiment having the above-described configuration will be described.

First, during the non-accelerated test, since the accelerated test control signal BIM is low, the differential amplifier 13 in the reference voltage comparator 8' is deactivated, as described in the second embodiment. The output signal VBI of the inverter 12b is a signal that has been output from the differential amplifier 13 of the reference voltage comparator 8' and then passed through the two stages of inverters and has the same polarity as that of the output of the differential amplifier 13. Thus, the output signal VBI becomes high. Accordingly, the P-type MOS transistor QP26, receiving the output signal VBI at the gate terminal thereof, is turned OFF and the N-type MOS transistor QN13, also receiving the output signal VBI at the gate terminal thereof, is turned ON. As a result, the differential amplifier 14 in the first internal reference voltage generator 10" receiving the first reference voltage VREF1 is activated. Therefore, during the non-accelerated test, the same operation as that of the second embodiment is performed.

Next, during the accelerated test, the characteristics of the internal reference voltage VIREF are determined based on the voltage characteristics of the first internal reference voltage VIREF1 generated by the first internal reference voltage generator 10" receiving the first reference voltage VREF1 if the external power supply voltage is within a voltage range in which the first reference voltage VREF1 is higher than the second reference voltage VREF2 (i.e., VEXT<V2) as described in the second embodiment. On the other hand, if the external power supply voltage is within a voltage range in which the second reference voltage VREF2 is higher than the first reference voltage VREF1 (i.e., VEXT≧V2), the internal reference voltage characteristics during the accelerated test are determined based on the voltage characteristics of the third internal reference voltage VIREF3 generated by the reference voltage comparator 8' and the accelerated test reference voltage generator 11. That is to say, the operation of the first internal reference voltage generator 10" receiving the first reference voltage VREF1 has nothing to do with the internal reference voltage characteristics if the external power supply voltage is within a voltage range in which the second reference voltage VREF2 is higher than the first reference voltage VREF1. During the accelerated test, if the external power supply voltage is within a voltage range in which the first reference voltage VREF1 is higher than the second reference voltage VREF2, the output signal VBI of the inverter 12b is high. On the other hand, if the external power supply voltage is within a voltage range in which the second reference voltage VREF2 is higher than the first reference voltage VREF1, the output signal VBI of the inverter 12b becomes low. Accordingly, the first internal reference voltage generator 10" receiving the first reference voltage VREF1 is activated if the external power supply voltage VEXT is smaller than the predetermined value V2 and is deactivated if the external power supply voltage VEXT is equal to or larger than the predetermined value V2.

As can be understood, by deactivating the first internal reference voltage generator 10" receiving the first reference voltage VREF1 if the external power supply voltage is within a voltage range in which the second reference voltage VREF2 is higher than the first reference voltage VREF1 and thereby reducing the steady current flowing through the differential amplifier 14 during the accelerated test, the power consumption can be reduced.

What is claimed is:

1. A semiconductor integrated circuit comprising:
   an internal circuit; and
   an internal voltage step down circuit for stepping down an external power supply voltage and supplying the stepped-down voltage to the internal circuit as an internal power supply voltage,
   wherein the internal voltage step down circuit includes:
      a reference voltage generator for generating a plurality of reference voltages, the reference voltages including a first reference voltage having substantially no dependence on the external power supply voltage and a second reference voltage having dependence on the external power supply voltage;
      a first internal power supply circuit for generating a first internal power supply voltage based on the first reference voltage and then supplying the first internal power supply voltage to the internal circuit;
      a second internal power supply circuit for generating a second internal power supply voltage based on the second reference voltage and then supplying the second internal power supply voltage to the internal circuit;
      a reference voltage comparator, controlled in response to an accelerated test control signal output during an accelerated test of the internal circuit, for comparing the first reference voltage and the second reference voltage with each other; and
      an accelerated test voltage supply circuit for supplying a third internal power supply voltage for the accelerated test to the internal circuit in response to an output signal of the reference voltage comparator while the accelerated test is performed.

2. The semiconductor integrated circuit of claim 1, wherein, if the external power supply voltage is within a voltage range in which the second reference voltage is higher than the first reference voltage during the accelerated test,
   the accelerated test voltage supply circuit is operated in response to the output signal of the reference voltage comparator, and supplies the third internal power supply voltage to the internal circuit.

3. A semiconductor integrated circuit comprising:
   an internal circuit; and
   an internal voltage step down circuit for stepping down an external power supply voltage and supplying the stepped-down voltage to the internal circuit as an internal power supply voltage,
   wherein the internal voltage step down circuit includes:
      a reference voltage generator for generating a plurality of reference voltages, the reference voltages including a first reference voltage having substantially no dependence on the external power supply voltage and a second reference voltage having dependence on the external power supply voltage;
      a first internal reference voltage generator for generating a first internal reference voltage for supplying a first internal power supply voltage based on the first reference voltage;
      a second internal reference voltage generator for generating a second internal reference voltage for supplying a second internal power supply voltage based on the second reference voltage;
      a reference voltage comparator, controlled in response to an accelerated test control signal output during an accelerated test of the internal circuit, for comparing the first reference voltage and the second reference voltage with each other;
      an accelerated test reference voltage generator for generating a third internal reference voltage for supplying a third internal power supply voltage for the accelerated test in response to an output signal of the reference voltage comparator while the accelerated test is performed; and
      an internal power supply circuit for supplying any of the first, second and third internal power supply voltages to the internal circuit based on the first, second and third internal reference voltages generated by the first and second internal reference voltage generators and the accelerated test reference voltage generator.

4. The semiconductor integrated circuit of claim 3, wherein, if the external power supply voltage is within a voltage range in which the second reference voltage is higher than the first reference voltage during the accelerated test,
   the accelerated test reference voltage generator is operated in response to the output signal of the reference voltage comparator, and generates the third internal reference voltage.

5. The semiconductor integrated circuit of one of claims 1, 2, 3 and 4, wherein the internal power supply voltage exhibits:

a first voltage characteristic having substantially no dependence on the external power supply voltage if the external power supply voltage is within an operability assuring voltage range of the semiconductor integrated circuit;

a second voltage characteristic having dependence on the external power supply voltage if the external power supply voltage is within a voltage range in which the second reference voltage is higher than the first reference voltage and while the non-accelerated test is being performed; and a third voltage characteristic having a rise rate higher than a rise rate of the second voltage characteristic and having dependence on the external power supply voltage if the external power supply voltage is within the voltage range in which the second reference voltage is higher than the first reference voltage and while the accelerated test is being performed.

6. The semiconductor integrated circuit of claim 1, wherein the accelerated test voltage supply circuit is constituted by an MOS transistor disposed between an external power supply terminal and a site where an internal power supply voltage is generated, and wherein if the external power supply voltage is within a voltage range in which the second reference voltage is higher than the first reference voltage during the accelerated test, the MOS transistor is turned ON and supplies an internal power supply voltage, equal to the external power supply voltage, to the internal circuit.

7. The semiconductor integrated circuit of one of claims 1, 2 and 6, wherein the accelerated test voltage supply circuit includes a P-type MOS transistor having a diode-connected gate and is disposed between the external power supply terminal and the site where an internal power supply voltage is generated, and wherein if the external power supply voltage is within a voltage range in which the second reference voltage is higher than the first reference voltage during the accelerated test, the P-type MOS transistor is turned ON and supplies the third internal power supply voltage to the internal circuit, the third internal power supply voltage being lower than the external power supply voltage by a threshold voltage of the P-type MOS transistor.

8. The semiconductor integrated circuit of one of claims 1, 2 and 6, wherein the accelerated test voltage supply circuit includes an N-type MOS transistor, having a diode-connected gate and is disposed between the external power supply terminal and the site where an internal power supply voltage is generated, and wherein if the external power supply voltage is within a voltage range in which the second reference voltage is higher than the first reference voltage during the accelerated test, the N-type MOS transistor is turned ON and supply the third internal power supply voltage to the internal circuit, the third internal power supply voltage being lower than the external power supply voltage by a threshold voltage of the N-type MOS transistor.

9. The semiconductor integrated circuit of claim 8, wherein the same impurity as an impurity implanted into a memory cell transistor of the internal circuit is implanted into the N-type MOS transistor, and wherein if the external power supply voltage is within a voltage range in which the second reference voltage is higher than the first reference voltage during the accelerated test, the N-type MOS transistor generates the third internal power supply voltage, the third internal power supply voltage being lower than the external power supply voltage by a voltage substantially equal to a threshold voltage of the memory cell transistor.

10. The semiconductor integrated circuit of one of claims 1 and 2, wherein the accelerated test voltage supply circuit includes, between an external power supply terminal and a site where the internal power supply voltage is generated:

a serial connection of a first MOS transistor controlled in response to the output signal of the reference voltage comparator and a second MOS transistor having a diode-connected gate; and a fuse connected in parallel to the second MOS transistor, and wherein if the external power supply voltage is within a voltage range in which the second reference voltage is higher than the first reference voltage during the accelerated test, the third internal power supply voltage is switchable by disconnecting the fuse.

11. The semiconductor integrated circuit of claim 3, wherein the accelerated test reference voltage generator is constituted by an MOS transistor disposed between an external power supply terminal and a site where the internal reference voltage is generated, and wherein if the external power supply voltage is within a voltage range in which the second reference voltage is higher than the first reference voltage during the accelerated test, the MOS transistor is turned ON and generates an internal reference voltage equal to the external power supply voltage.

12. The semiconductor integrated circuit of one of claims 3, 4 and 11, wherein the accelerated test reference voltage generator includes a P-type MOS transistor having a diode-connected gate and being disposed between the external power supply terminal and the site where the internal reference voltage is generated, and wherein if the external power supply voltage is within a voltage range in which the second reference voltage is higher than the first reference voltage during the accelerated test, the P-type MOS transistor is turned ON and generate an internal reference voltage, the internal reference voltage being lower than the external power supply voltage by a threshold voltage of the P-type MOS transistor.

13. The semiconductor integrated circuit of one of claims 3, 4 and 11, wherein the accelerated test reference voltage generator includes an N-type MOS transistor having a diode-connected gate and being disposed between the external power supply terminal and the site where the internal reference voltage is generated, and wherein if the external power supply voltage is within a voltage range in which the second reference voltage is higher than the first reference voltage during the accelerated test, the N-type MOS transistor is turned ON and generate an internal reference voltage, the internal reference voltage being lower than the external power supply voltage by a threshold voltage of the N-type MOS transistor.

14. The semiconductor integrated circuit of claim 13, wherein the same impurity as an impurity implanted into a memory cell transistor of the internal circuit is implanted into the N-type MOS transistor, and wherein if the external power supply voltage is within a voltage range in which the second reference voltage is higher than the first reference voltage during the accelerated test, the N-type MOS transistor generates an internal reference voltage, the internal reference voltage being lower than the external power supply voltage by a voltage substantially equal to a threshold voltage of the memory cell transistor.

15. The semiconductor integrated circuit of one of claims 3 and 4, wherein the accelerated test reference voltage generator includes, between an external power supply terminal and a site where the internal reference voltage is generated:

a serial connection of a first MOS transistor controlled in response to the output signal of the reference voltage comparator and a second MOS transistor having a diode-connected gate; and a fuse connected in parallel to the second MOS transistor, and wherein if the external power supply voltage is within a voltage range in which the second reference voltage is higher than the first reference voltage during the accelerated test, the third internal reference voltage is switchable by disconnecting the fuse.

16. The semiconductor integrated circuit of one of claims 1 and 2, wherein an output of the reference voltage comparator has hysteresis characteristics, and wherein if the external power supply voltage is within a voltage range in which the second reference voltage is higher than the first reference voltage during the accelerated test, the third internal power supply voltage has hysteresis characteristics with respect to a variation of the external power supply voltage.

17. The semiconductor integrated circuit of one of claims 3 and 4, wherein an output of the reference voltage comparator has hysteresis characteristics, and wherein if the external power supply voltage is within a voltage range in which the second reference voltage is higher than the first reference voltage during the accelerated test, the third internal reference voltage has hysteresis characteristics with respect to a variation of the external power supply voltage.

18. The semiconductor integrated circuit of one of claims 1 and 2, wherein the second internal power supply circuit is controlled in response to the accelerated test control signal to stop supplying the second internal power supply voltage during the accelerated test.

19. The semiconductor integrated circuit of claim 18, wherein the second internal power supply circuit includes a differential amplifier and an internal power supplying driver, and wherein the differential amplifier is controlled in response to the accelerated test control signal to stop operating during the accelerated test.

20. The semiconductor integrated circuit of one of claims 3 and 4, wherein the second internal reference voltage generator is controlled in response to the accelerated test control signal to stop supplying the second internal reference voltage during the accelerated test.

21. The semiconductor integrated circuit of claim 20, wherein the second internal reference voltage generator includes a differential amplifier and an internal reference voltage generating driver, and wherein the differential amplifier is controlled in response to the accelerated test control signal to stop operating during the accelerated test.

22. The semiconductor integrated circuit of one of claims 1 and 2, wherein the first internal power supply circuit is controlled in response to the output signal of the reference voltage comparator, and wherein if the external power supply voltage is within a voltage range in which the second reference voltage is higher than the first reference voltage during the accelerated test, the first internal power supply circuit stops supplying the first internal power supply voltage.

23. The semiconductor integrated circuit of claim 22, wherein the first internal power supply circuit includes a differential amplifier and an internal power supplying driver, and wherein the differential amplifier is controlled in response to the output signal of the reference voltage comparator, and wherein if the external power supply voltage is within a voltage range in which the second reference voltage is higher than the first reference voltage during the accelerated test, the differential amplifier stops operating.

24. The semiconductor integrated circuit of one of claims 3 and 4, wherein the first internal reference voltage generator is controlled in response to the output signal of the reference voltage comparator, and wherein if the external power supply voltage is within a voltage range in which the second reference voltage is higher than the first reference voltage during the accelerated test, the first internal reference voltage generator stops generating the first internal reference voltage.

25. The semiconductor integrated circuit of claim 24, wherein the first internal reference voltage generator includes a differential amplifier and an internal reference voltage generating driver, and wherein the differential amplifier is controlled in response to the output signal of the reference voltage comparator, and wherein if the external power supply voltage is within a voltage range in which the second reference voltage is higher than the first reference voltage during the accelerated test, the differential amplifier stops operating.

* * * * *